(12) United States Patent
Hasegawa et al.

(10) Patent No.: US 7,710,528 B2
(45) Date of Patent: May 4, 2010

(54) ELECTRO OPTICAL DEVICE AND ELECTRONIC APPARATUS

(75) Inventors: Kazuya Hasegawa, Azumino (JP); Tatsumi Okuda, Motosu (JP)

(73) Assignee: Epson Imaging Devices Corporation (JP)

( * ) Notice: Subject to any disclaimer, the term of this patent is extended or adjusted under 35 U.S.C. 154(b) by 263 days.

(21) Appl. No.: 11/941,626

(22) Filed: Nov. 16, 2007

(65) Prior Publication Data

US 2008/0165316 A1 Jul. 10, 2008

(30) Foreign Application Priority Data

Jan. 5, 2007 (JP) ............................. 2007-000423

(51) Int. Cl.
G02F 1/1345 (2006.01)
(52) U.S. Cl. ...................................... 349/149; 349/150
(58) Field of Classification Search ................. 349/149, 349/150, 151, 152; 174/254, 255; 345/206; 361/749, 789
See application file for complete search history.

(56) References Cited

U.S. PATENT DOCUMENTS

| 7,095,476 | B2 | 8/2006 | Lo et al. |
| 7,115,980 | B2 | 10/2006 | Miyagawa et al. |
| 2002/0018169 | A1* | 2/2002 | Kato .......................... 349/149 |
| 2005/0253773 | A1 | 11/2005 | Sekiguchi |

FOREIGN PATENT DOCUMENTS

| JP | 63-165683 | 10/1988 |
| JP | 06-265853 | 9/1994 |
| JP | 2000-066204 | 3/2000 |
| JP | 2001-249353 | 9/2001 |
| JP | 2003-131250 | 5/2003 |
| JP | 2004-235321 | 8/2004 |
| JP | 2005-322729 | 11/2005 |
| JP | 2006-119491 | 5/2006 |
| JP | 2006-154324 | 6/2006 |
| JP | 2006-184383 | 7/2006 |
| JP | 2006-234975 | 9/2006 |
| JP | 2006-243428 | 9/2006 |
| JP | 2006-301135 | 11/2006 |
| WO | WO 2004/029918 | 4/2004 |

* cited by examiner

Primary Examiner—Dung Nguyen
Assistant Examiner—Tai Duong
(74) Attorney, Agent, or Firm—Harness, Dickey & Pierce, P.L.C.

(57) ABSTRACT

There is provided an electro optical device including an electro optical panel formed by sticking a first substrate and a second substrate together, and a flexible wiring substrate connected to the electro optical panel. The first substrate includes a extension portion flaring from the second substrate, the wiring substrate includes a base material having flexibility and a conductive pattern provided on the base material, the wiring substrate is connected to the extension portion of the first substrate by using an adhesive agent, the wiring substrate includes a wide width portion connected to the extension portion and a narrow width portion continuing to the wide width portion and extending outwardly from an edge side of the extension portion in the flaring direction, and an edge side of the wide width portion at the narrow width portion side is matched to the position of the edge side of the extension portion in the flaring direction or is positioned inside of the edge side of the extension portion in the flaring direction.

10 Claims, 10 Drawing Sheets

ELECTRO OPTICAL DEVICE AND ELECTRONIC APPARATUS

The entire disclosure of Japanese Patent Application No. 2007-000423, filed Jan. 5, 2007 is expressly incorporated by reference herein.

BACKGROUND

1. Technical Field

The present invention relates to an electro optical device such as a liquid crystal display device. Further the present invention relates to an electronic apparatus using the electro optical device.

2. Related Art

An electro optical device such as a liquid crystal display device or an EL device has now been widely used in various electronic apparatuses such as a mobile phone or a mobile information terminal device. For example, the electro optical device is used as a display portion for visually displaying various information that relate to the electronic apparatus. As for the electro optical device, a device using a liquid crystal as an electro optical material, that is a liquid crystal device has been known.

In the liquid crystal device described above, a liquid crystal which is an electro optical material is enclosed between a pair of substrates to from a liquid crystal panel as an electro optical panel having a panel structure. Generally, a wiring substrate, for example, an FPC (Flexible Printed Circuit) substrate is often connected to the liquid crystal panel in order to apply a predetermined voltage to the liquid crystal (for example, see JP-A-2003-131250 (hereinafter, referred to as Patent Document 1 (fifth page, FIG. 1)) or JP-A-2006-301135 (hereinafter, referred to as Patent Document 2 (fourth page, FIG. 1)).

For example, a circuit required for driving the liquid crystal panel is formed on the FPC substrate. The circuit is usually formed by forming a predetermined conductive pattern on a base substrate and if required, mounting electronic parts such as an IC, a condenser, a coil, a resistance on a predetermined position on the base substrate. Further, an input terminal is formed on the FPC substrate and an external power source and various external apparatuses may be connected to the input terminal. In this case, a signal and electric power for driving the liquid crystal panel are supplied from the external apparatuses and the external power source via the FPC substrate. Further, for the structure using a plurality of liquid crystal panel, for example, for the liquid crystal device having a structure in which two liquid crystal panels are provided to the both surfaces of the electronic apparatus, the FPC substrate may be used for electrically connecting between the two liquid crystal panels.

Incidentally, the FPC substrate is generally connected to the liquid crystal panel in the state where the FPC substrate is bent in a predetermined shape. Further, the liquid crystal panel connected to the FPC substrate is often adhered and fixed to, for example, a frame having a frame shape or the like by using a double-faced tape or the like. In the state where the FPC substrate is bent in such a manner, a force to return the FPC substrate to the original shape is generated inside the FPC substrate by the elasticity of the FPC substrate itself. Consequently, there is a fear in that the liquid crystal panel is unstuck and floated from the frame by the elastic force generated by bending the FPC substrate.

In the liquid crystal device disclosed in Patent Document 1, the width of the portion of the FPC substrate extending from the liquid crystal panel is widely formed. To be more specific, the width of the FPC substrate is approximately set to the same width as the width of the panel substrate. In the structure, a force to return the FPC substrate to the original shape becomes large when the FPC substrate is bent, so that there is a fear in that the liquid crystal panel is unstuck and floated from the frame.

Further, in the liquid crystal device disclosed in Patent Document 2, a portion of the FPC substrate extending from the liquid crystal panel is formed in the shape in which the width is gradually narrowed as the portion is apart form the liquid crystal panel. However, the width of the FPC substrate positioned nearest the liquid crystal panel is widely formed. Accordingly, when the FPC substrate is bent, the force to return the FPC substrate to the original shape becomes large. As a result, there is a fear in that the liquid crystal panel is unstuck and floated from the frame.

Further, the liquid crystal panel is required to be formed in a low-profile shape. Accordingly, the panel substrate which is a component of the liquid crystal panel is also required to be formed in a low-profile shape. However, when the panel substrate is narrowed, the strength of the panel substrate is weakened. Consequently, the panel substrate becomes easily broken by an external force, for example, vibration, impact, elastic force of the FPC substrate connected to the liquid crystal panel, or the like. In particular, the portion of the liquid crystal panel connected to the FPC substrate is generally formed by a flaring one panel substrate, so that the extension portion formed by the one substrate becomes easily broken.

SUMMARY

An advantage of some aspects of the invention is that it provide an electro optical device and an electronic apparatus including a flexible wiring substrate such as an FPC substrate which make it possible to prevent an electro optical panel to be floated from a frame when the wiring substrate connected to the electro optical panel is bent and to prevent the substrate to be broken even when the substrate constituting the electro optical panel such as a liquid crystal panel is a thin liquid crystal panel.

According to an aspect, of the invention, there is provided an electro optical device (1) including an electro optical panel formed by sticking a first substrate and a second substrate together, and a flexible wiring substrate connected to the electro optical panel. (2) The first substrate includes a extension portion flaring from the second substrate. (3) The wiring substrate includes a base material having flexibility and a conductive pattern provided on the base material. (4) The wiring substrate is connected to the extension portion of the first substrate by using an adhesive agent. (5) The wiring substrate includes a wide width portion connected to the extension portion and a narrow width portion continuing to the wide width portion and extending outwardly from an edge side of the extension portion in the flaring direction. (6) An edge side of the wide width portion at the narrow width portion side is matched to the position of the edge side of the extension portion in the flaring direction or is positioned inside of the edge side of the extension portion in the flaring direction.

Note that the ward "match" in the embodiment not only includes the case of complete match but also includes the case when considered as "match" in the functional basis such as the case when there is a different within the range of error of part and assembling error.

In the structure, the electro optical panel is a panel structure which can change an optical output state by controlling electrical input conditions. Further, the electro optical panel is a panel structure containing an electro optical material such as liquid crystal and display is performed by utilizing the electrical operation of the electro optical material. The electro optical panel is formed by disposing an electro optical material on the substrate formed by a glass or the like or enclosing an electro optical material between a pair of substrates. When, for example, liquid crystal is used as the electro optical material, a liquid crystal panel as an electro optical panel is constituted. Further, generally, in the electro optical device, a component such as an electro optical panel is housed in a frame having a frame shape formed by, for example, a resin.

In the above structure, the flexible wiring substrate is often bent into a desired shape at an extending portion extending from the extension portion of the first substrate of the electro optical panel. For example, the flexible wiring substrate may be bent so that the bending angle is set to approximately 180 degrees (that is, turned over). Further, the flexible wiring substrate may be adhered to the frame having a flame shape by using a double-stick tape.

In the electro optical device having the structure, when the wiring is bent, the electro optical panel may be unstuck and floated from the frame due to the elastic restoring force of the wiring substrate. Further, a stress is generated at the extension portion of the first substrate due to the elastic restoring force of the wiring substrate. As described above, the conductive pattern of the wiring substrate is provided along the connecting portion and the extending portion. Accordingly, the generation of such a stress is unavoidable. Further, when the width of the wiring substrate is wide and the length of the extending portion along the extending direction is short, the stress to be generated may be increased.

In this regard, in the electro optical device according to the invention, "the edge side of the wide width portion of the wiring substrate at the narrow width portion side is matched to the position of the edge side of the extension portion in the flaring direction or is positioned inside of the position of the edge side of the extension portion in the flaring direction. Accordingly, the wide of the bent portion can be reduced as compared with the case where the wiring substrate whose width is wide without change is extending form the extension portion of the first substrate as in Patent Document 1 and the case where the wide width portion is extending form the extension portion even when the wide width portion and the narrow width portion is provided in the wiring substrate as in Patent Document 2.

The restoring force to be generated due to the elasticity of the wiring substrate when the wiring substrate is bent can be reduced if the width of the portion to be bent in the wiring substrate can be narrowed in this way. Accordingly the electro optical panel can be prevented to be unstuck and floated from the frame. Further, the stress generated at the extension portion of the first substrate due to the elasticity of the wiring substrate can be reduced. Accordingly, the breakage of the extension portion of the first substrate due to the elastic force of the wiring substrate can be prevented.

It is preferable that "the length La of the wide width portion projecting from a side of the narrow width portion as for the direction perpendicular to the extending direction of the narrow width portion of the wiring substrate shall be set to satisfy $La \geq 1.5$ mm". Herewith, the area of the wiring substrate overlapping with the extension portion of the first substrate is increased. Generally, the wiring substrate is adhered to the extension portion of the first substrate by an adhesive agent such as an ACF (Anisotropic Conductive Film). In this case, the portion of the extension portion overlapping with the wiring substrate is united with the wiring substrate by the adhesive agent. Accordingly, the mechanical strength of the portion is reinforced as compared with the portion of only the extension portion of the first substrate (that is strengthened). Accordingly, when the area of the wiring substrate overlapping with the extension portion in the aspect of the invention as described above, the mechanical strength of the extension portion of the first substrate can be enhanced. As a result, the first substrate can be prevented from breakage by external force, for example, such as impact or vibration.

Note that, the basis that the length La of the wide width portion projecting from the side of the narrow width portion is set to satisfy $La \geq 1.5$ mm goes like this. First, in the conventional electro optical device, a fine projecting piece may be provided to the connecting portion of the wiring substrate. The projecting piece has been utilized, for example, as an alignment mark when the wiring substrate is mounted on the electro optical panel. The projecting length of the projecting piece has been set to not more than about 1.0 mm. In the conventional electro optical device equipped with such a short projecting piece, the extension portion of the substrate of the electro optical panel may have been frequently broken by an external force. On the contrary, when the length La of the wide width portion projecting form the side of the narrow width portion is set to $La \geq 1.5$ mm, the generation number of the breakage of the extension portion of the substrate of the electro optical panel is reduced.

Further, in the state where the electro optical panel is housed in the frame having a frame shape, the narrow width portion of the flexible wiring substrate connected to the electro optical panel is often bent so as to warp a portion of the frame. In this case, the portion of the flame overlapping with the narrow width portion of the wiring substrate is formed so that the thickness becomes thin (or size becomes slim) so that the narrow width portion can be easily bent. When the length of the portion whose thickness is thin (or size is slim) in the width direction is increased, the strength of the frame is weakened. As a result, there is a fear in that the strength of the electro optical device is weakened. In this regard, when the length La of the wide width portion projecting from the side of the narrow wide portion shall be set to $La \geq 1.5$ mm and the width of the area in which the thickness (or size) of the frame can be thickly (or largely) formed is increased, the strength of the frame can be fully assured.

The reason that the length La of the wide width portion projecting from the side of the narrow wide portion is regulated to $La \geq 1.5$ mm in the aspect of the invention is based on each the knowledge described above.

Next, it is preferable that a distal end of the wide width portion extends to the position matching to a side of the extension portion of the first substrate. Herewith, the area of the wiring substrate overlapping the extension portion of the first substrate via the adhesive agent can be increased. As a result, the mechanical strength of the extension portion of the first substrate can be enhanced. As a result, the breakage of the first substrate by an external force, for example, such as impact or vibration can be prevented.

Next, it is preferable that the wide width portion is adhered to the extension portion to enhance the impact strength resistance and bending strength resistance of the extension portion. Herewith, the mechanical strength of the extension portion of the first substrate can be enhanced. As a result, the breakage of the first substrate by an external force such as impact or vibration can be prevented.

As described above, according to the aspect of the invention, the electro optical panel is prevented to be unstuck and floated from the frame when the narrow width portion of the wiring substrate is bent. Further, by the cooperative operation of reducing the stress generated at the extension portion of the first substrate when the narrow width portion of the wiring substrate is bent and enhancing the mechanical strength of the extension portion of the first substrate by the operation of the wide width portion of the wiring substrate, the breakage of the extension portion of the first substrate can be prevented when the extension portion receives an external force such as impact or vibration.

Next, it is preferable that if a length of the narrow width portion of the wiring substrate in the extending direction is Lb and a length of the narrow width portion of the wiring substrate in the direction perpendicular to the extending direction is Lc, the relation of Lb<Lc is satisfied. In particular, preferably, the relation of 0.10Lc≦Lb≦0.15Lc is satisfied.

That is, it is preferable that the length of the narrow width portion of the wiring substrate in the extending direction is short and the length in the width direction perpendicular thereto (that is, the width) is long. The structure means that the portion of the wiring substrate to be bent is short, the curvature of the wiring substrate is large, or the wiring substrate is bent by a large force within a narrow range when the wiring substrate connected to the electro optical substrate is bent. When the portion of the wiring substrate to be bent is short, the elastic restoring force of the wiring substrate becomes large and a large bending stress is generated at the connecting portion between the substrate of the electro optical panel and the wiring substrate. Accordingly, the possibility of the substrate to be broken is high. In such a case, it is very profitable to prevent the breakage of the substrate in such a case where the strengthened structure of the substrate according to the aspect of the invention is employed.

Next it is preferable that a width of the narrow width portion of the wiring substrate in the direction perpendicular to the extending direction of the narrow width portion and the width of the whole area of the narrow width portion along the extending direction is the same as or narrower than the width of the narrow wide portion at the border between the wide width portion and the narrow width portion. Further, it is preferable that the width of the narrow wide portion is a constant width.

As described above, in the state where the electro optical panel is housed in the frame having a frame shape, the narrow width portion of the flexible wiring substrate connected to the electro optical panel is often bent so as to wrap of a part of the frame. In this case, the portion of the frame overlapping with the narrow width portion of the wiring substrate is formed so that the thickness becomes thin (or size becomes slim) so that the narrow width portion can be easily bent. When the length of the portion whose thickness is thin (or size is slim) is increased in the width direction becomes long, the strength of the frame becomes weak. As a result, there is a fear in that the strength of the electro optical device is weakened.

In this regard, as described above, it is regulated that a width of the narrow width portion of the wiring substrate in the direction perpendicular to the extending direction of the narrow width portion and the width of the whole area of the narrow width portion along the extending direction is the same as or narrower than the width of the narrow wide portion at the border between the wide width portion and the narrow width portion. That is, the maximum width of the narrow width portion of the wiring substrate is regulated to the same as the width of the extending portion of the wide width portion projecting from the narrow width portion or to not more than the width. This means that the width of the whole area of the narrow width portion of the wiring substrate along the extending direction is regulated so as to be uniformly narrowed as compared with the width of the conventional extending portion. Accordingly, the width of the area in which the thickness (or size) of the frame can be thickly (largely) formed can be increased as compared with the conventional frame. Herewith, the strength of the frame can be increased. As a result, the strength of the electro optical device can be increased.

Next, it is preferable that a shape of a corner of the border between the wide width portion and the narrow width portion of the wiring substrate is a curve shape. In the aspect of the invention, the flexible wiring substrate is connected to the electro optical panel so that the edge side of the wide width portion at the narrow width portion is matched to or positioned inside of the edge sided of the extension portion in the flaring direction. Accordingly, the corner of the border between the wide width portion and the narrow width portion of the flexible wiring substrate is approximately matched to the edge side of the extension portion of the first substrate. In the structure, when the flexible wiring substrate is bent, a tress tends to intensively occur at the corner of the border between the wide width portion and the narrow width portion. When such an intensive stress is generated, the flexible wiring substrate becomes easily fractured form the corner. In this regard, in the aspect of the invention, the shape of the corner of the border between the wide width portion and the narrow width portion of the flexible wiring substrate is set to a curve shape. Accordingly, the intensive generation of the stress at the corner can be avoided. Accordingly, the fracture of the flexible wiring substrate from the corner can be prevented.

Note that it is preferable that the curve shape of the corner between the wide width portion and the narrow width portion is set to a circular shape. Then if the diameter of the circular is R, it is more preferable that the R satisfies 0.5 mm≦R≦10.0 mm Herewith, the flexible wiring substrate can be surely prevented from fracture from the corner without blocking the flexibility at the narrow width portion of the flexible wiring substrate.

Next, it is preferable that a test terminal used for testing of the electro optical panel is provided on the extension portion of the first substrate, and the test terminal is covered by the wide width portion of the wiring substrate and the adhesive agent. Herein, the detection terminal is a terminal used when performing a display test of the electro optical panel. For example, in the manufacturing process of the electro optical device, a display test is performed by inputting an electric signal to the single electro optical panel after the electro optical panel is completed and before parts and the like are mounted on the electro optical panel. The test terminal is no longer used after completed as a product, so that the test terminal is subjected to isolating after the display test. The isolating has been conventionally performed by covering the test terminal by a resin such as silicon.

However, the resin such as silicon is a material which is difficult to form into a thin shape. Accordingly, it has been difficult to form the electro optical panel into a thin shape. Further, it is required to provide a process for applying a resin such as silicon. This may increase the manufacturing cost. In the aspect of the invention, the test terminal is covered by the wide width portion of the flexible wiring substrate. The flexible wiring substrate can be formed into a thin shape as compared with silicon even when the thickness of an adhesive agent is added. Accordingly, the flexible wiring substrate can be preferably used for a low profile electro optical panel. Further, it is not required to provide a process for applying a resin such as silicon, so that the manufacturing coast can be reduced.

Next, it is preferable that the wiring substrate is connected on the surface of the extension portion of the first substrate at the second substrate side, and the combined thickness of the wiring substrate and the adhesive agent is matched to the thickness of the second substrate. Generally, the electro optical device is often covered by, for example, an outer frame formed by using a metal. In this case, when the thickness of the second substrate is thin, a space is made between the extension portion connected to the wiring substrate and the outer frame covering the extension portion connected to the wiring substrate. Accordingly there is a fear in that the extension portion is broken by vibration or impact due to the space.

In this regard, in the aspect of the invention, the combined thickness of the wiring substrate and the adhesive agent is matched to the thickness of the second substrate, so that the space between the extension portion of the substrate and the outer frame can be filled in just enough by the wiring substrate and the adhesive agent. As a result, breakage of the extension portion caused by movement of the extension portion by vibration or impact can be prevented.

Next, according to another aspect of the invention, there is provided an electronic apparatus having the electro optical device having the structure described above. In the electronic apparatus according to the aspect of the invention, the electro optical panel is prevented to be unstuck and floated from the frame by narrowing the width of the narrow width portion than the wide width portion of the flexible wiring substrate. Further, the stress generated at the extension portion can be reduced by narrowing the width of the narrow width portion than the wide width portion of the flexible wiring substrate. Further, the extension portion of the first substrate can be strengthened by the wide width portion of the flexible wiring substrate. By the synergistic effect, the first substrate of the electro optical panel can be prevented from breakage at the extension portion. Accordingly, in the electronic apparatus according to the aspect of the invention using the electro optical device, floating of the electro optical panel in the electro optical device and breakage of the substrate can be prevented. Consequently, occurrence of failure can be reduced.

BRIEF DESCRIPTION OF THE DRAWINGS

The invention will be described with reference to the accompanying drawings, wherein like numbers reference like elements.

FIG. 5A is a plan view and FIGS. 5B, 5C, and 5D are each a cross sectional view.

FIG. 10A is a diagram showing the electronic apparatus in closed state and FIG. 10B is a diagram showing the electronic apparatus in an opened state.

DESCRIPTION OF EXEMPLARY EMBODIMENTS

First Embodiment of Electro Optical Device

Figure 1:
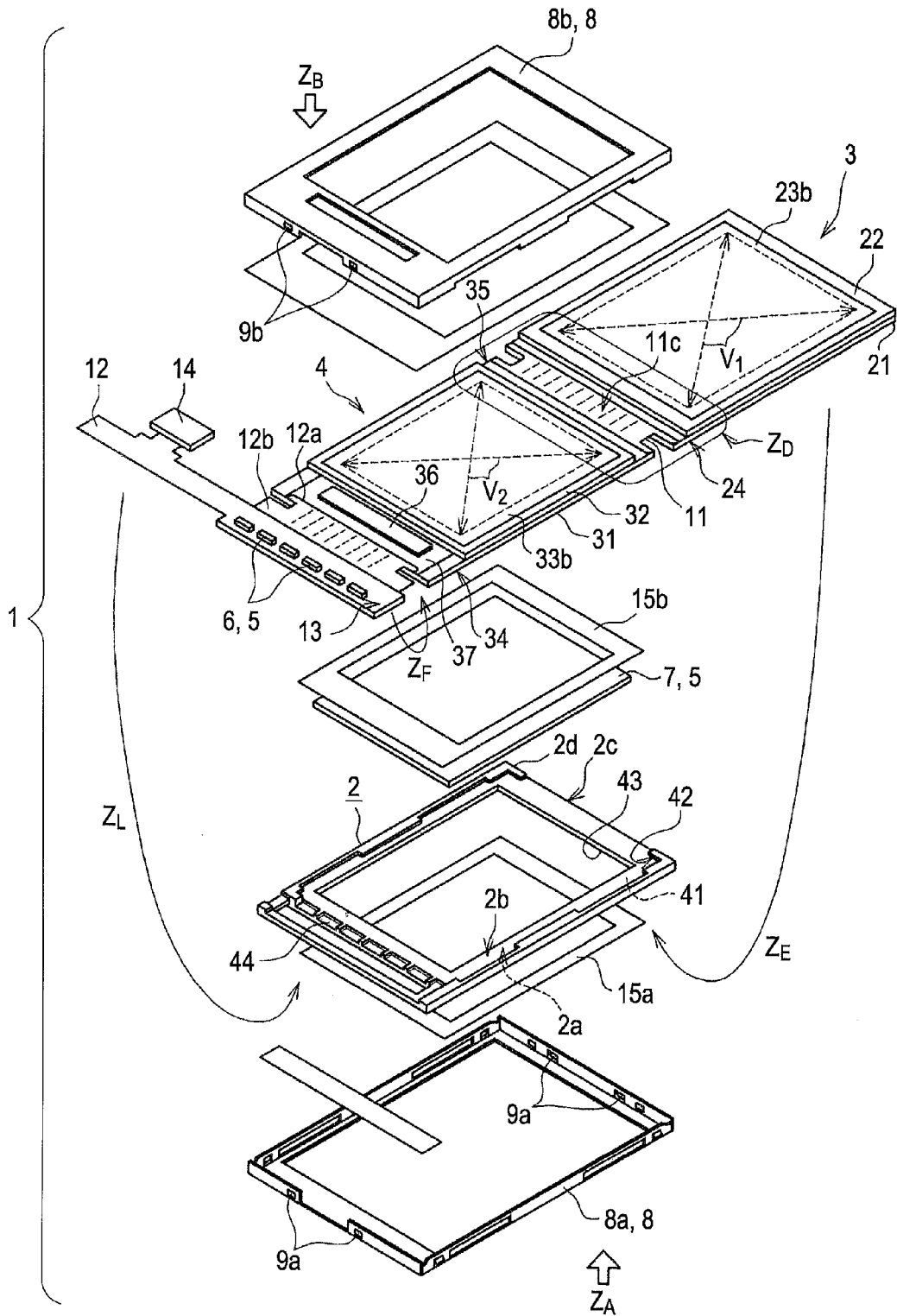
FIG. 1 is an exploded perspective view showing a liquid crystal display device of an embodiment of an electro optical device according to the invention.

Hereinafter, an electro optical device according to the invention will be described with reference to a first embodiment thereof. Note that the embodiment described below is an example of the invention and the invention is not limited to the embodiment. The description will be made with reference to the accompanying drawings as needed. However, in the drawings, in order to clearly show the main components among the structure formed by a plurality of components, each component is shown by a relative size different from the actual size.

Figure 2:
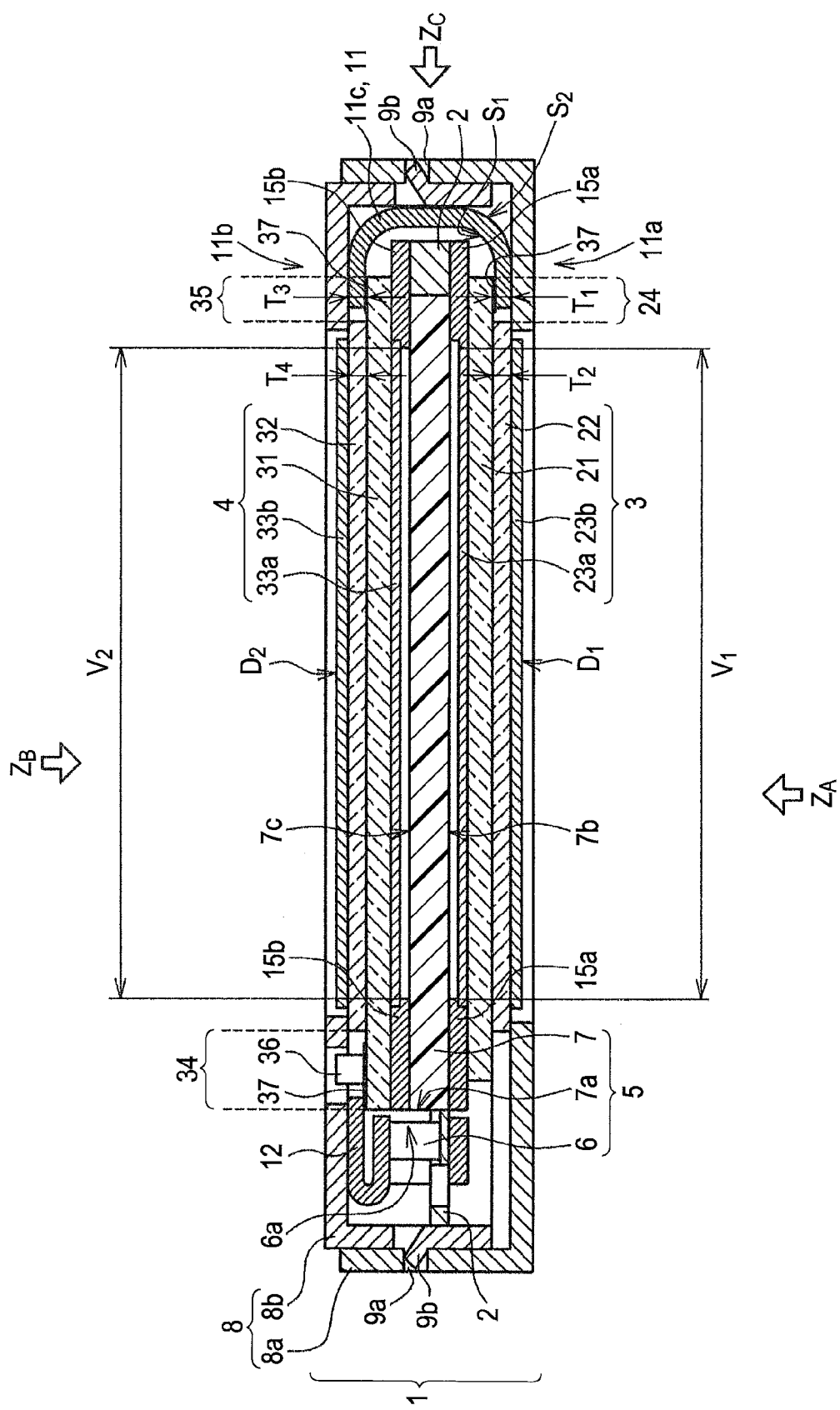
FIG. 2 is a cross sectional view showing a cross sectional structure of the liquid crystal display device shown in FIG. 1.
Figure 3:
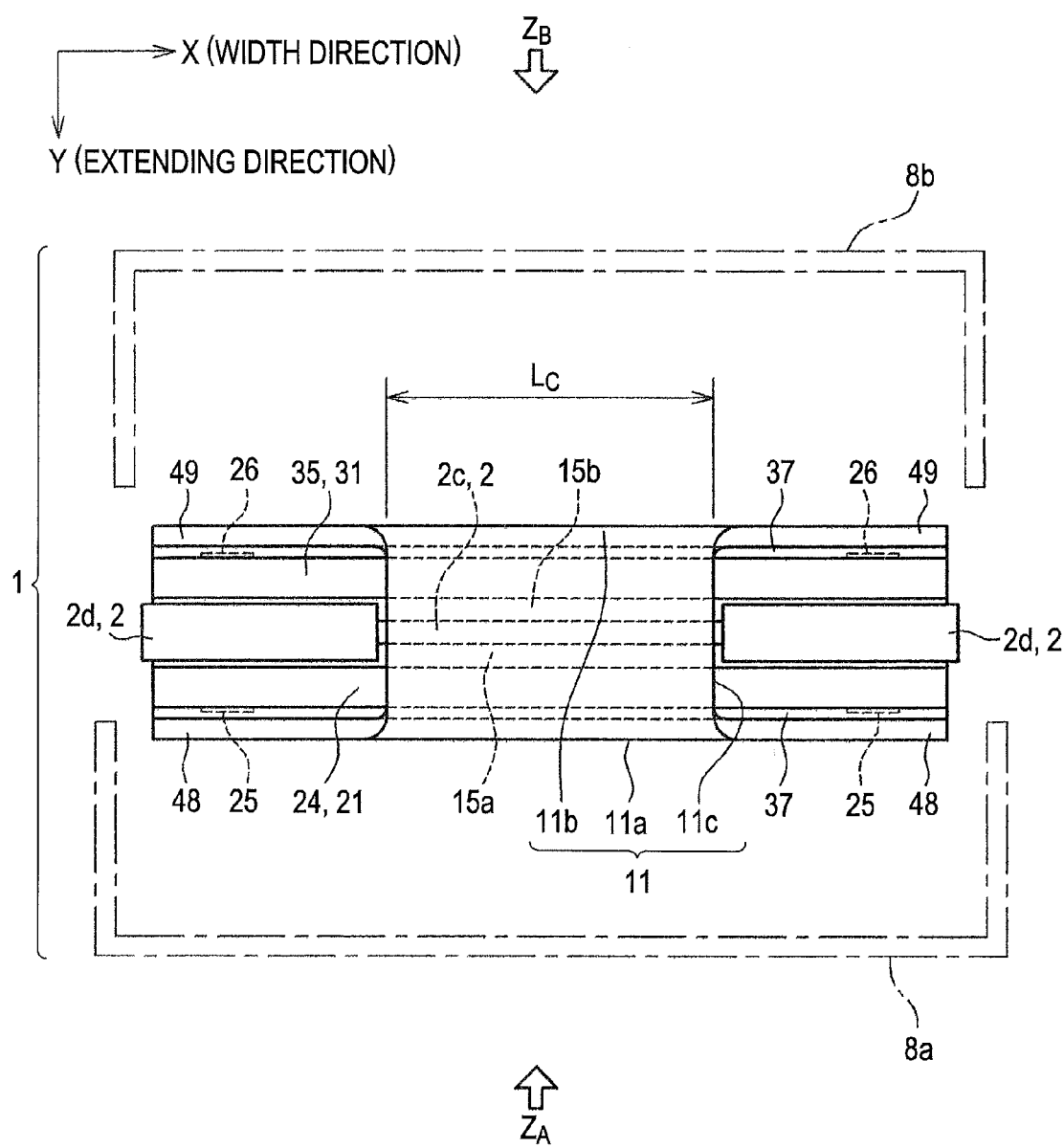
FIG. 3 is a side view showing the liquid crystal display device of FIG. 2 from the side shown by the arrow $Z_C$.
Figure 4:
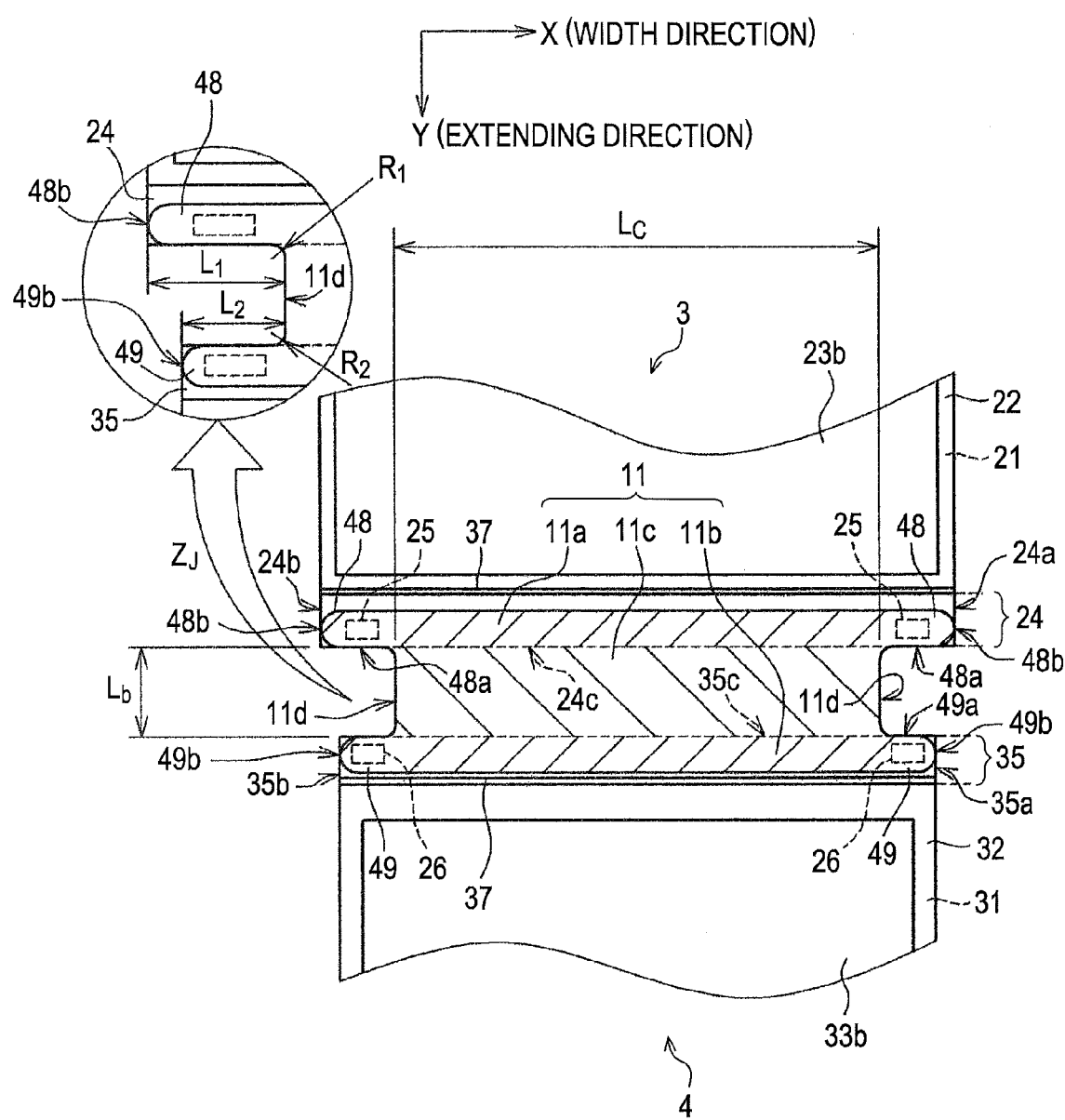
FIG. 4 is an enlarged plan view showing the portion shown by the arrow $Z_D$ in FIG. 1.

FIG. 1 is an exploded view showing a liquid crystal display device 1 as an example of an electro optical device according to the invention. FIG. 2 is a cross sectional view showing a structure in the state where the liquid crystal display device 1 of FIG. 1 is assembled. FIG. 3 is a diagram showing a side structure of the liquid crystal display device 1 in FIG. 2 viewed from the direction shown by the arrow $Z_C$. FIG. 4 is a plan view showing a wiring portion between panels shown by the arrow $Z_D$ of FIG. 1 when viewed from the direction shown by the arrow $Z_B$.

As shown in FIG. 1, the liquid crystal display device 1 includes a frame 2 which is a supporting member, a first liquid crystal panel 3 as a first electro optical panel supported by the frame 2, a second liquid crystal panel 4 as a second electro optical panel also supported by the frame 2, and a pair of upper and lower outer frames 8 covering the frame 2, the first liquid crystal panel 3, and the second liquid crystal panel 4. In the embodiment, the first liquid crystal panel 3 is a display element for the main display, and the second liquid crystal panel 4 is a display element for the sub display.

In the embodiment, the liquid crystal display device 1 shall be a low-profile liquid crystal display device. Accordingly, a low-profile panel is employed for each of the first liquid crystal panel 3 and the second liquid crystal panel 4. The thickness of the first crystal liquid panel 3 and the second liquid crystal panel 4 shall be set to, for example, not more than 0.6 mm. Further, the thickness of the individual substrates constituting the liquid crystal panel shall be set to, for example, not more than 0.3 mm. An illuminating device 5 is provided inside of the frame 2. The illuminating device 5 includes light sources, specifically an LED (Light Emitting Diode) 6 as point-like light sources, and a light guide body 7 for converting the point-like light emitted from the LED 6 into surface-like light to emit it. The light guide body 7 is formed by, for example, a translucent resin.

A plurality of LED's 6 (six in the embodiment) are provided. The six LED's 6 are mounted on an LED mounting area 13 of a second FPC substrate 12 described below. The second FPC substrate 12 has a terminal 14 and electric power is supplied to each LED 6 via the terminal 14. As shown in FIG. 2, a light emitting surface 6a of each LED 6 is provided so as to be opposed to a light introducing surface 7a which is a side surface of the light guide body 7. The light emitted from each LED 6 is introduced into the light guide body 7 from the light introducing surface 7a. When display is performed by the first liquid crystal panel 3, the light introduced into the light guide body 7 is emitted from a first light emitting surface 7b as surface-like light and supplied to the first liquid crystal panel 3. On the other hand, when display is performed by the second liquid crystal panel 4, the light introduce into the light guide body 7 is emitted from a second light emitting surface 7c as surface-like light and supplied to the second liquid crystal panel 4.

Although omitted in the drawings, various optical elements, for example, a light reflection layer, a light diffuse layer, and the like are provided as needed on the first light emitting surface 7b opposing the first liquid crystal layer 3 and the second light emitting surface 7c opposing the second liquid crystal layer 4 of the light introducing body 7. The illumination device 5 is disposed at the back side of the first liquid crystal panel 3 when viewed from the direction shown by the arrow $Z_A$ and functions as a back light. Further, the illumination device 5 is disposed at the backside of the second liquid crystal panel 4 when viewed from the direction shown by the arrow $Z_B$ and functions as a back light. Note that the light source may be constituted by a point-like light source except the LED 6 or by a line-like light source such as a cold-cathode tube.

An adhesive sheet 15a is provided between the illuminating device 5 and the first liquid crystal panel 3. In FIG. 1, the adhesive sheet 15a is formed in a frame shape having an opening whose size is approximately the same as a viewing area V1 of the first liquid crystal panel 3. Further, the adhesive sheet 15a is formed by a material having light blocking effect. The frame 2 and the first liquid crystal panel 3 are adhered by the adhesive sheet 15a. Herein, the adhesion means the level in which the frame 2 and the first liquid crystal panel 3 can be easily unstuck by hand.

Further, in FIG. 2, an adhesive sheet 15b is provided between the second liquid crystal panel 4 and the frame 2. In FIG. 1, the adhesive sheet 15b is formed in a frame shape having an opening whose size is approximately the same as a viewing area V2 of the second liquid crystal panel 4. Further, the adhesive sheet 15a is formed by a material having light blocking effect. The frame 2 and the second liquid crystal panel 4 are adhered by the adhesive sheet 15b. Thus, the illuminating device 5, the first liquid crystal panel 3, and the second liquid crystal panel 4 are housed inside the frame 2.

The first liquid crystal panel 3 includes a first translucent substrate 21, a second translucent substrate 22, a polarizer 23a adhered on the outside surface of the first translucent substrate 21, and a polarizer 23b adhered on the outside surface of the second translucent substrate 22. The polarization axis of the polarizer 23a and the polarization axis of the polarizer 23b are set so that the angles of the axes are appropriately misaligned in accordance with the operation mode of the liquid crystal panel. Note that another optical element, for example, a phase difference plate or the like may be provided in addition to the polarizers 23a, 23b. The first translucent substrate 21 includes a extension portion 24 flaring outwardly of one side of the second translucent substrate 22. Test terminals 25 are provided on the surface of the extension portion 24 at the second translucent substrate 22 side as shown in FIG. 4. The test terminal 25 is provided one by one at each of the neighborhood of the one side 24a and the neighborhood of the other side 24b of the extension portion 24.

Next, in FIG. 2, the second liquid crystal panel 4 includes a first translucent substrate 31, a second translucent substrate 32, a polarizer 33a adhered on the outside surface of the first translucent substrate 31, and a polarizer 33b adhered on the outside surface of the second translucent substrate 32. The polarization axis of the polarizer 33a and the polarization axis of the polarizer 33b are set so that the angles of the axes are appropriately misaligned in accordance with the operation mode of the liquid crystal panel. Note that another optical element, for example, a phase difference plate or the like may be provided in addition to the polarizers 33a, 33b. The first translucent substrate 31 includes extension portions 34, 35 flaring outwardly of the second translucent substrate 32. The extension portion 34 is a extension portion of an input side and the extension portion 35 is a extension portion of a relay side. A driving IC 36 is mounted on the extension portion of the input side by, for example, a CPO (Chip On Glass) technique by using an ACF (Anisotropic Conductive Film) 37 which is an adhesive agent. Test terminals 26 are provided on the surface of the relay side extension portion 35 at the second translucent substrate 32 side as shown in FIG. 4. The test terminal 35 is provided one by one at each of the neighborhood of the one side 35a and the neighborhood of the other side 35b of the extension portion 35.

The test terminals 25 and 26 are terminals used when performing display test of the first liquid crystal panel 3 and the second liquid crystal panel 4. For example, in the process for manufacturing the first liquid crystal panel 3, an electronic signal is input into the stand-alone first liquid crystal panel 3 to perform display test by using the test terminals 25 after the first translucent substrate 21 and the second translucent substrate 22 are stuck together and before a wiring substrate and the like are mounted on the first liquid crystal panel 3. Also, in the process for manufacturing the second liquid crystal panel 4, an electronic signal is input into the stand-alone second liquid crystal panel 4 to perform display test by using the test terminals 26 after the second translucent substrate 31 and the second translucent substrate 32 are stuck together and before a wiring substrate and the like are mounted on the second liquid crystal panel 4. The test terminals 25, 26 are no longer used after the liquid crystal display device 1 is manufactured as a product.

As the detail is omitted in the drawings, an electrode is provided between the surfaces of the first translucent substrate 21 and the second translucent substrate 22 constituting the first liquid crystal panel 3 opposing each other and liquid crystal is enclosed between the substrates. Further, an electrode is provided between the surfaces of the first translucent substrate 31 and the second translucent substrate 32 constituting the second liquid crystal panel 4 opposing each other and liquid crystal is enclosed between the substrates. In FIG. 2, when surface-like light is supplied from the illuminating device 5 to the first liquid crystal panel 3, and when surface-like light is supplied from the illuminating device 5 to the second liquid crystal panel 4, the light passing through the liquid crystal is modulated for every pixel by controlling the voltage applied to the pair of electrodes opposing each other in each liquid crystal panel 3 and 4 for every pixel.

Then, in the first liquid crystal panel 3, by passing the modulated light through the polarizer 23b, an image such as a character, a figure, a graphic is displayed at the light emitting side of the polarizer 23b. The direction shown by the arrow $Z_A$ is the direction from which the first liquid crystal panel 3 is observed and the surface on which the polarizer 23b is provided is a display surface $D_1$. On the other hand, in the second liquid crystal panel 4, by passing the modulated light through the polarizer 33b, an image such as a character, a figure, a graphic is displayed at the light emitting side of the polarizer 33b. The direction shown by the arrow $Z_B$ is the direction from which the second liquid crystal panel 4 is observed and the surface on which the polarizer 33b is provided is a display surface $D_2$.

The same display mode of liquid crystal panels can be used for the first liquid crystal panel 3 and the second liquid crystal panel 4. Then, the panels can be constituted by any display mode. For example, any of a simple matrix system and an active matrix system may be employed for liquid crystal driving system. Further, as for the type of liquid crystal mode, any liquid crystal, such as TN (Twisted Nematic), STN (Super Twisted Nematic), liquid crystal having negative anisotropy of dielectric constant (that is, liquid crystal for vertical alignment) may be used. Further, as for light introducing system, any type such as reflection type, transmission type, semi transmission type having both properties of transmission and reflection may be employed.

The reflection type is a system used for displaying by reflecting the external light such as sunlight, room light in the first liquid crystal panel 3 and the second liquid crystal panel 4. Further, the transmission type is a system used for displaying by using the light passed through the first liquid crystal panel 3 and the second liquid crystal panel 4. Further, the semi transmission type is a system which can selectively perform both of the reflection type displaying and the transmission type displaying. Note that, as the illuminating device 5 is provided as a backlight in the embodiment, transmission type or semi transmission type shall be employed as the light introducing system.

The simple matrix system is a matrix system which does not have an active element in each pixel, in which the crossing portion of a scanning electrode and a data electrode corresponds to a pixel or a dot, and in which a driving signal is directly applied. As for the liquid crystal mode corresponding to the system, TN, STN, vertical alignment mode or the like is used. Then, the active matrix system is a matrix system in which an active element is provided for every pixel or a dot, in which the active element becomes ON state during a writing period and a data voltage is written, and in which the active element becomes OFF state during a non-writing period and the voltage is kept. A three terminal type and a two terminal type are used for the active element in the system. For example, TFT (Thin Film Transistor) is included as the active element of the three terminal type. Further, for example, TFD (Thin Film diode) is included as the active element of the two terminal type.

In the above described first liquid crystal panel 3 and the second liquid crystal panel 4, when performing color display, a color filter is provided on one of the pair of substrates. The color filter is formed by a plurality of filters through which the light having a particular wavelength area is selectively transmitted. For example, the color filter is formed by aligning each R, G, and B color which are three primary colors so as to correspond to each pixel on the substrate, for example, in a stripe alignment, a delta alignment, or a mosaic alignment. Note that, when clear color development is desired, a pixel may be constituted by four colors in which another color (for example, blue green) is added to R, G, B.

Next, a second FPC substrate 12 which is a flexible wiring substrate is connected to the edge side of the extension portion 34 of the input side of the first translucent substrate 31 of the second liquid crystal panel 4 by using the ACF 37. The second FPC substrate 12 has a structure formed by forming a conductive pattern on the surface of a base film formed by polyamide, polyester or the like. As shown in FIG. 1, the second FPC substrate 12 includes a connecting portion 12a which is a portion overlapping with the extension portion 34 of the input side in plan view and an extending portion 12b which is a portion extending from the extension portion 34.

Although omitted in the drawings, an electronic circuit and a wire attached thereto are formed on the surface of the extending portion 12b. An LED mounting area 13 is provided at a part of the extending portion 12b and the plurality of LED's 6 are mounted on the area 13. Further, an input terminal 14 is provided at a portion extending from the LED mounting area 13 to a further side direction. The terminal 14 is connected to an external input apparatus (for example, a control circuit for an electronic apparatus such as a mobile phone), an external power source, or the like. The second FPC substrate 12 is bent as shown in the arrow $Z_F$ when assembling the liquid crystal display device 1 and the LED mounting area 13 mounting the LED's 6 is disposed so as to be opposed to an LED supporting portion 44 of the frame 2 described below.

Further, a first FPC substrate 11 as a wiring substrate having flexibility is connected to the flaring direction edge side of the extension portion 24 of the first translucent substrate 21 of the first liquid crystal panel 3 by using, for example, the ACF 37 (see FIG. 2). The detail of the first FPC substrate 11 will be described below.

Next, the frame 2 includes a first panel housing 41, a second panel housing 42, a light guide body housing 43, and an LED supporting portion 44. The first panel housing 41 is provided at a first surface 2a side of the frame 2 which is the side at which the arrow $Z_A$ is drawn. The first panel housing 41 is a space formed inside the frame 2 and the first liquid crystal panel 3 is housed in the space in the state where the first liquid crystal panel 3 is bent as shown by the arrow $Z_E$. Further, the second panel housing 42 is provided at a second surface 2b side of the frame 2 which is the side at which the arrow $Z_B$ is drawn. The second panel housing 42 is a space formed inside the frame 2 and the second liquid crystal panel 4 is housed in the space. Further, the light guide body housing 43 is a space corresponding to the opening of the frame 2 and the light guide body 7 is housed in the light guide body housing 43. Further, the LED supporting portion 44 is provided at the second surface 2b side of the frame 2. The LED's 6 mounted on the second FPC substrate 12 are supported by the LED supporting portion 44.

Next, the pair of upper and lower outer frames 8 includes a first outer frame 8a provided at the first liquid crystal panel 3 side (the side at which the arrow $Z_A$ is drawn) after bend in the direction shown by the arrow $Z_E$ and a second outer frame 8b provided at the second liquid crystal panel 4 side (the side at which the arrow $Z_B$ is drawn). The first and second outer frames 8a, 8b are formed, for example, by using a metal such as a stainless. The first outer frame 8a is formed in a frame shape having an opening whose size is approximately the same as the viewing area V1 of the first liquid crystal panel 3. Further, the second outer frame 8b is formed in a frame shape having an opening whose size is approximately the same as the viewing area V2 of the second liquid crystal panel 4.

A plurality of joints 9a are provided in the first outer frame 8a. Further, a plurality of joints 9b are provided in the second outer frame 8b. Each of the plurality of joints 9a is provided at the position so as to correspond to the corresponding one of the plurality of joints 9b. As shown in FIG. 2, the plurality of joints 9a and the plurality of joints 9b are combined in the state where the liquid crystal display device 1 is assembled and the first outer frame 8a and the second outer frame 8b are integrally connected.

When the liquid crystal display device 1 in FIG. 1 is assembled, the illuminating device 5, the first liquid crystal panel 3, and the second liquid crystal panel 4 are attached to the frame 2 as shown in FIG. 2. To be more specific, in FIG. 1, first, the light guide body 7 is housed in the light guide housing 43 in the frame 2 and then, the second liquid crystal panel 4 is housed in the second panel housing 42. At this time, the second liquid crystal panel 4 is adhered to the light guide body 7 and the frame 2 by the adhesive sheet 15b.

Then, the first liquid crystal panel 3 is housed in the first panel housing 41. To be more specific, the first FPC substrate 11 connecting the first liquid crystal panel 3 and the second crystal panel 4 is bent so as to wrap the edge side 2c of the frame 2 as shown by the arrow $Z_E$. Consequently, the first liquid crystal panel 3 is moved on the surface of the first surface 2a of the frame 2 and housed in the first panel housing 41. At this time, the first liquid crystal panel 3 is adhered to the light guide body 7 and the frame 2 by the adhesive sheet 15a. The positions of the first liquid crystal panel 3, the second liquid crystal panel 4, and the light guide body 7 are regulated by the frame 2 in the right and left direction and the vertical direction in FIG. 2. Herewith, the first liquid crystal panel 3, the second liquid crystal panel 4, and the light guide body 7 are always positioned at predetermined positions in the frame 2.

Next, in FIG. 1, the second FPC substrate 12 is bent to the back side of the second liquid crystal panel 4 as shown by the arrow $Z_F$ and the LED mounting area 13 on which the LED's 6 are mounted is disposed so as to be opposed to the LED supporting portion 44 of the frame 2 described below. Further, the portion at which the input terminal 14 is provided is bent to the back side of the frame from the side direction as shown by the arrow $Z_L$ and the input terminal 14 is disposed at the first surface 2a side of the frame 2. As described above, the second outer frame 8b is attached at the second liquid crystal panel 4 side in the state where the first liquid crystal panel 3 and the second liquid crystal panel 4 are housed in the frame 2. Then, the first outer frame 8a is attached to the first liquid crystal panel 3 side. At this time, the joints 9a of the first outer frame 8a and the joints 9b of the second outer frame 8b are jointed, so that the outer frames 8 are fixed to the frame 2 in the state where the first liquid crystal panel 3 and the second liquid crystal panel are covered by the outer frames 8. As described above, the liquid crystal display device 1 shown in FIG. 2 is completed.

Figure 5A:
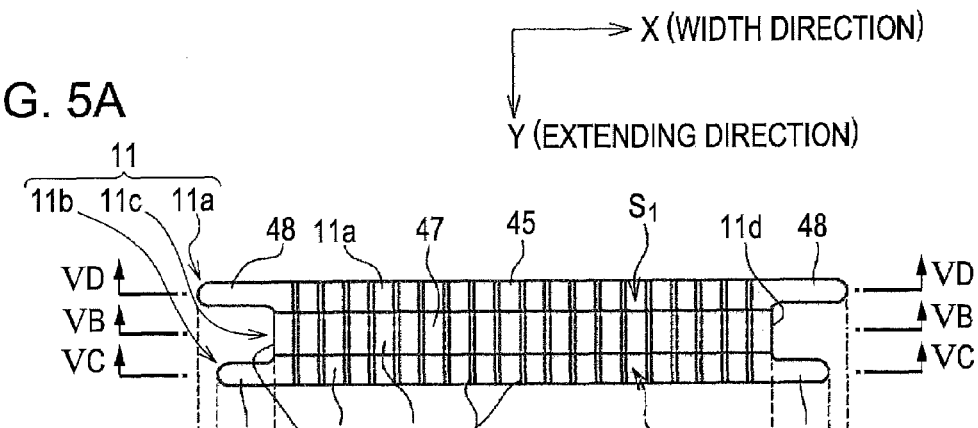
FIGS. 5A to 5D are each a diagram showing a detail of a first FEP substrate which is a wiring substrate of the first embodiment.
Figure 5B:
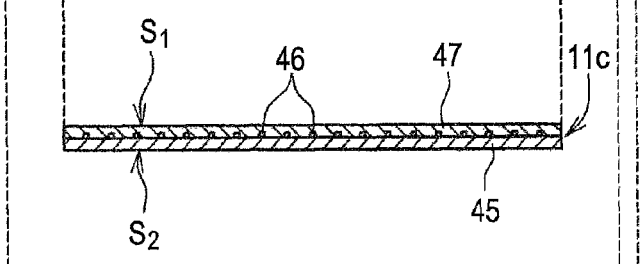
Figure 5C:
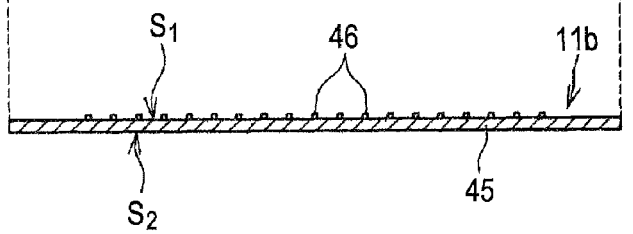
Figure 5D:
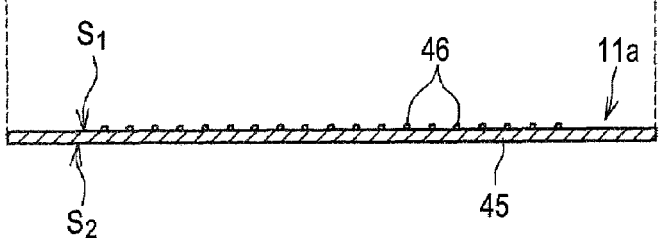

Hereinafter, the first FPC substrate 11 as a flexible wiring substrate used for the liquid crystal display device of the embodiment will be described in detail. FIG. 5A is a plan view showing the first FPC substrate 11 in FIG. 1 from the direction shown by the arrow $Z_A$. FIG. 5B is a cross sectional view of the center portion of the first FPC substrate taken along the line VB-VB of FIG. 5A. Further, FIG. 5C is a cross sectional view of the first FEP substrate 11 taken along the line VC-VC of FIG. 5A. Further, FIG. 5D is a cross sectional view of the first FPC substrate 11 taken along the line VD-VD of FIG. 5A.

The first FPC substrate 11 is a substrate having a fine flexibility formed by a flexible film as a base material. When the first FPC substrate 11 is bent as shown by the arrow $Z_E$ in FIG. 1, the first FPC substrate 11 has a surface S1 opposing the frame 2 and a surface S2 which is the opposite surface of the surface S1. The S1 is bent to be the inner surface and the S2 is bent to be the outer surface.

The first FEP substrate 11 includes a connecting portion 11a which is a wide width portion (the portion shown by the diagonal lines sloping down to the left) overlapping with the extension portion 24 of the first liquid crystal panel 3 in plan view, a connecting portion 11b which is a wide width portion (the portion shown by the diagonal lines sloping down to the left) overlapping with the extension portion 35 of the second liquid crystal panel 35 at the relay side in plan view, and an extending portion 11c which is a narrow width portion (the portion shown by the diagonal lines sloping down in the right) extending from the extension portion 24 and the extension portion 35 to the outward directions thereof. In FIG. 4, the first liquid crystal panel 3 is bent to the back side of the drawing with respect to the second liquid crystal panel 4. Hereinafter, the direction to which the extending portion 11c extends from the extension portions 24, 35 is referred to as extending direction Y and the width direction of the first FPC substrate 11 perpendicular thereto is referred to as width direction X.

As shown in FIG. 5A, the first FPC substrate 11 includes a base film 45 as a flexible base material, a conductive pattern 46, and a protection film 47. The base film 45 is formed by using, for example, polyimide, polyester, or the like. The conductive pattern 46 is formed by using a conductive material, for example, such as Cu (copper) or the like. The conductive pattern 46 is provided across each area of the connecting portion 11a, extending portion 11c, and connecting portion 11b. The first liquid crystal panel 3 and the second liquid crystal panel 4 are conductively connected with the conductive pattern 46.

The protection film 47 is formed by using, for example, a cover lay, a resist, or the like. The protection film 47 is provided on the extending portion 11c, and as shown in FIG. 5B, the shape of the protection film 47 is set so as to cover the surface of the base film 45 and the conductive pattern 46. By covering the conductive pattern 46 with the protection film 47, the conductive patter 46 is prevented to be eroded due to adhesion of water and foreign substance on the conductive pattern 46.

Hereinafter, the structure of the first FPC substrate 11 will be described in detail.

First, the connecting portion 11a as a wide width portion will be described. The connecting portion 11a includes a base film 45 and a conductive pattern 46 provided on the base film 45 as shown in FIG. 5D. Note that the protection film 47 is not provided on the connecting portion 11a. Accordingly, the surface of the base film 45 and conductive pattern 46 are bared in the connecting portion 11a.

The connecting portion 11a is a portion connected to a terminal (not shown) of the first liquid crystal panel 3 at the extension portion 24 of the first liquid crystal panel as shown in FIG. 4. Accordingly, the conductive pattern 46 (see FIG. 5A) is bared in the connecting portion 11a. However, the conductive pattern 46 is covered by the ACF 37 which is an adhesive agent in the state where the first FPC substrate 11 and the first liquid crystal panel 3 are connected. Accordingly, the erosion of the conductive patter 46 caused by adhesion of water and foreign substance can be prevented. Note that in FIG. 2, the combined thickness T1 of the connecting portion 11a and the ACF 37 is matched with the thickness T2 of the second translucent substrate 22. Note that the ward "match" in the specification also includes the case when a different is occurred by error of part and assembling error.

In FIG. 5A, projecting pieces 48 projecting to the outward directions from sides 11d of the extending portion 11c in the width direction X are provided on the both side of the area in which the conductive pattern 46 of the connecting portion 11a is formed. The projecting pieces 48 are formed by projecting the base film 45 form the area in which the conducting patter 46 is formed to the width direction X.

The projecting pieces 48 are formed in the shape as described below.

(1) Edge sides 48a of the projecting pieces 48 at the side of the extending portion 11c are set in parallel with an edge side 24c of the extension portion 24 of the first substrate 21 in the liquid crystal panel 3 in the flaring direction in the state where the first FPC substrate 11 is connected with the first liquid crystal panel 3 as shown in FIG. 4. Further, (2) the edge sides 48a of the projecting pieces 48 and the edge side 24c of the extension portion 24 are positionally matched in plan view (note that, the edge sides 48a of the projecting pieces 48a may be positioned at the inner side of the edge side 24c of the extension portion 24). Further, (3) distal ends 48b of the projecting pieces 48 and sides 24a, 24b of the extension portion 24 are positionally matched in plan view. That is, the length of the connecting portion 11 in the width direction X and the width of the extension portion 24 are matched. Further, (4) as shown with an enlarged view shown by the arrow $Z_J$, the projecting length L1 which is the length of each of the projecting pieces 48 projecting from the sides 11d of the extending portion 11c to the width direction X is set so as to satisfy the relation of $L1 \geqq 1.5$ mm.

Further, the shape of the proximal portions of the projecting pieces 48 (that is the borders between the projecting pieces 48 and the extending portion 11c), that is the shape of the corners formed by the edge sides 48a of the projecting pieces 48 and the sides 11d of the extending portion 11c is formed in a curve shape, to be more specific, a portion of a circle, a portion of an ellipsoid, a portion of an ellipse, or a portion of a parabola. In the embodiment, the curve shape is formed to a portion of a circle (that is, a circular arc) and the relation of R1=0.5 mm is satisfied if the diameter of the circular arc is R1. Note that R1 is set to any value of 0.5 mm$\leqq$R1, preferably, is set to 0.5 mm$\leqq$R1$\leqq$1.0 mm.

The reason for setting R1 to such a value is that a cracking may easily be generated from the corner of R1 when the FPC substrate 11 is bent if R1<0.5 mm and the bending stress at the corner of R1 becomes too large if 1.0 mm<R1.

As described above, the test terminals 25 are provided on the right and left surface of the extension portion 24. Each of the projecting pieces 48 covers the corresponding one of the test terminal 25. To be more specific, as shown in FIG. 3, the connecting portion 11a including the projecting pieces 48 is adhered on the extension portion 24 by the ACF 37. Accordingly, the projecting pieces 48 extending on the test terminals 25 are adhered by the ACF 37 on the test terminals 25, so that the test terminals 25 are covered by the projecting pieces 48 and the ACF 37.

Next, the connecting portion 11b as a wide width portion of FIG. 5C will be described. The connecting portion 11B includes, a base film 45 and a conductive pattern 46 provided on the base film 45. Note that the protection film 47 is not provided on the connecting portion 11b. Accordingly, the surface of the base film 45 and the conductive pattern 46 are bared in the connecting portion 11b. As shown in FIG. 4, the connecting portion 11b is a portion connected to a terminal (not shown) of the second liquid crystal panel 4 at the extension portion 35 of the relay side of the second liquid crystal panel 4. Accordingly, the conductive pattern 46 (see FIG. 5A) is bared in the connecting portion 11b. However, the conductive pattern 46 is covered by the ACF 37 which is an adhesive agent in the state where the first FPC substrate 11 and the second liquid crystal panel 4 are connected. Accordingly, the erosion of the conductive patter 46 caused by adhesion of water and foreign substance can be prevented. Note that in FIG. 2, the combined thickness T3 of the connecting portion 11b and the ACF 37 is matched with the thickness T4 of the second translucent substrate 32 in the second liquid crystal panel 4.

In FIG. 5A, projecting pieces 49 projecting to the outward directions from the sides 11d of the extending portion 11c which is a narrow width portion to the width direction X are provided on the both side of the area in which the conductive pattern 46 of the connecting portion 11b is formed. The projecting pieces 49 are formed by projecting the base film 45 form the area in which the conducting patter 46 is formed to the width direction X.

The projecting pieces 49 are formed in the shape as described below.

(1) Edge sides 49a of the projecting pieces 49 at the side of the extending portion 11c are set in parallel with an edge side 35c of the extension portion 35 of the first substrate 31 in the liquid crystal panel 4 in the flaring direction in the state where the first FPC substrate 11 is connected with the second liquid crystal panel 4 as shown in FIG. 4. Further, (2) the edge sides 49a of the projecting pieces 49 and the edge side 35c of the extension portion 35 are positionally matched in plan view (note that, the edge sides 49a of the projecting pieces 49a may be positioned at the inner side of the edge side 35c of the extension portion 35). Further, (3) distal ends 49b of the projecting pieces 49 and sides 35a, 35b of the extension portion 35 are positionally matched in plan view. That is, the length of the connecting portion 11 in the width direction X and the width of the extension portion 35 are matched. Further, (4) as shown with an enlarged view shown by the arrow $Z_J$, the projecting length L2 which is the length of each of the projecting pieces 49 projecting from the sides 11d of the extending portion 11c to the width direction X is set so as to satisfy the relation of $L2 \geqq 1.5$ mm.

Further, the shape of the proximal portions of the projecting pieces 49 (that is the borders between the projecting pieces 49 and the extending portion 11c), that is the shape of the corners formed by the edge sides 49a of the projecting pieces 49 and the sides 11d of the extending portion 11c is formed in a curve shape, to be more specific, a portion of a circle, a portion of an ellipsoid, a portion of an ellipse, or a portion of a parabola. In the embodiment, the curve shape is formed to a portion of a circle (that is, a circular arc) and the relation of R2=0.5 mm is satisfied if the diameter of the circular arc is R2. Note that R2 is set to any value of 0.5 mm$\leqq$R2, preferably, is set to 0.5 mm$\leqq$R2$\leqq$1.0 mm.

The reason for setting R2 to such a value is that to prevent the generation of a cracking from the corner R2 similarly to the case of the other connecting portions 11a and to prevent that the bending stress is increased so much at the corner R2.

As described above, the test terminals 26 are provided on the right and left surface of the extension portion 35. Each of the projecting pieces 49 covers the corresponding one of the test terminal 26. To be more specific, as shown in FIG. 3, the connecting portion 11b including the projecting pieces 49 is adhered on the extension portion 35 by the ACF 37. Accordingly, the projecting pieces 49 extending on the test terminals 26 are adhered by the ACF 37 on the test terminals 26, so that the test terminals 26 are covered by the projecting pieces 49 and the ACF 37.

Next, the extending portion 11c of the FPC substrate 11 extending from the extension portion 24 of the first liquid crystal panel 3 and the extension portion 35 of the second liquid crystal panel in FIG. 4 is an intermediate portion which joints the connecting portion 11a and the connecting portion 11b as shown in FIG. 5. In the embodiment, the width of the extending portion 11a (that is, the length in the width direction X) and the width of the whole area along the extending direction Y is set to the same width as the width of the extending portion 11c at the border between the projecting pieces 48 and the extending portion 11c. Note that, in the embodiment, the sides 11d of the extending portion 11c are extending in the direction perpendicular to the edge sides 48a of the projecting pieces 48 in FIG. 4. Accordingly, the width of the extending portion 11 at the border between the projecting pieces 48 and the extending portion 11c is the same as the width of the extending portion 11c at the border between the other projecting pieces 49 and the extending portion 11c. That is, the width of the extending portion 11c is a constant along the extending direction Y and the width is the same as the widths of the portions of the extending portion 11c which are the starting points of projection of the projecting pieces 48, 49. This means that the width of the whole area of the extending portion 11c of the FPC substrate 11 along the extending direction Y is evenly regulated to a narrow width so that no part of the extending portion 11c is projected.

As shown in FIG. 2, the liquid crystal panels 3, 4 are housed in the frame 2 having a frame shape. At this time, the first FPC substrate 11 connecting the liquid crystal panels 3, 4 is bent so that the extending portion 11c wraps a portion of the frame 2. In this case, the part of the frame 2 overlapping with the extending portion 11c of the FPC substrate 11 when vied from the direction shown by the arrow $Z_C$ is formed so that the thickness becomes thin (or size becomes slim) so that the extending portion 11c can be easily bent. When the width of the portion whose thickness is thin (or size is slim) is increased (that is, when the length in the width direction is increased), the strength of the frame becomes week. As a result, there is a fear in that the strength of the whole electro optical device is reduced.

In this regard, in the embodiment, the whole width of the extending portion 11b of the FPC substrate 11 along the extending direction Y is regulated to the width $L_C$ which is the same as the widths of the extending portion 11c at the borders between the projecting pieces 48, 49 and the extending portion 11c. Herewith, the width of the whole area of the extending portion 11c along the extending direction Y is evenly regulated to a narrow width so that no part of the extending portion 11c is widened. As a result, the length of the area in the width direction X in which the thickness (or size) of the frame 2 in the extending direction Y can be thickly (or largely) formed can be widened. Accordingly, the strength of the frame 2 can be enhanced, so that the strength of the electro optical device can be enhanced.

Further, by setting the length L1 of the projecting pieces 48 to L1≧1.5 mm and the length L2 of the projecting pieces 49 to L2≧1.5 mm, the width $L_C$ of the extending portion 11c can be formed to a fully narrow width. Further, as for the enhancing the strength of the frame 2, the length of the area in the width direction X in which the thickness (or size) of the frame 2 in the extending direction Y can be thickly (or largely) formed can be fully widened.

As is understood from the description described above, in order to allow that the length of the area in the width direction X in which the thickness (or size) of the frame 2 in the extending direction Y can be thickly (or largely) formed, the thickness of the extending portion 11c (the length in the width direction X) is required so as not to project at somewhere among the whole area along the extending direction Y. In order to realize the requirement, it is required that the width of the extending portion (the length in the width direction) is kept at the constant width $L_C$ which is the width of the borders between the projecting pieces 48, 49 and the extending portion 11c along the whole area in the extending direction Y, or is kept narrower than the width $L_C$.

In the embodiment, in FIG. 4, the length Lb of the extending portion 11 of the first FPC substrate 11 in the extending direction shall be set to 3.0 mm≦Lb≦4.0 mm, and the length Lc of the extending portion 11c in the width direction X shall be set to 29 mm≦Lc≦31 mm.

In the first FPC substrate 11 of the structure, the length in the direction in which the first FPC substrate 11 is bent (that is, in the extending direction Y) is remarkably set shorter than the length of the area in which the first FPC substrate 11 is mounted on the substrate (that is in the width direction X). When the substrate 11 is bent as shown by the arrow $Z_E$ in FIG. 1, a large external force is to be applied to the adhered substrate. Accordingly, there is a fear in that the substrate is unstuck from the frame 2 or the substrate is damaged.

However, in the embodiment, the stress generated at the substrate extension portions 24, 35 of the liquid crystal panels 3, 4 when the extending portion 11c of the first FPC substrate 11 is bent is reduced by devising the shapes between the connecting portions 11a, 11b and the extending portion 11c of the first FPC substrate 11. Further, the mechanical strength of the substrate extension portions 24, 35 is enhanced by providing the projecting pieces 48, 49 at the connecting portions 11a, 11b of the first FPC substrate 11 and by adhering the projecting pieces 48, 49 to the substrate extension portions 24, 35. By the combination of the operations, an enough mechanical strength can be provided to the first FPC substrate 11 having the shape in which the length of the extending portion 11c in the extending direction is shorter than the width of the extending portion 11c.

Experiment conducted by the inventor has shown that enough strength can be provided to the substrate and the substrate can be protected from damage when the first substrate 11 having a wide width and a short extending length that satisfies the size parameter of 0.10Lc≦Lb≦0.15Lc is adhered to the substrate of the liquid crystal panel.

Next, in the liquid crystal display device 1 having the structure shown in FIG. 1, when the extending portion 11c of the first FPC substrate 11 is bent as shown by the arrow $Z_E$, the force to return the first FPC substrate 11 to the original shape, that is to a straight shape, is generated. In the conventional liquid crystal display device, the width of the extending portion has been widely formed. For example, the width of the extending portion is formed to have the width approximately the same as the width of the substrate forming the liquid crystal panel. In the structure, when the extending portion is bent, the force to return the extending portion to the original shape becomes strong. In this case, there is a fear in that the liquid crystal panel may be peeled off and floated from the frame. Further, there is a fear in that a large stress is generated at the extension portion of the translucent substrate and the panel substrate may be damaged. In the embodiment, the first liquid crystal panel 3 and the second liquid crystal panel 4 are formed in a low-profile. Accordingly, there is a tendency that the strength of the panel itself is weakened as compared with the conventional thick liquid crystal panel. Accordingly, in the embodiment, when a large stress is generated at the extension portion of the substrate, the damage possibility of the substrate is enhanced.

In this regard, in the embodiment, in FIG. 4, as for the connecting portion of the first FPC substrate 11 and the first liquid crystal panel 3, the edge sides 48a of the projecting pieces 48 of the connecting portion 11a at the extending portion 11c side are set in parallel to the edge side 24c of the extension portion 24, and the edge sides 48a of the projecting pieces 48 and the edge side 24c of the extension portion 24 are set so as to be positionally matched in plan view. As for the connecting portion of the first FPC substrate 11 and the second liquid crystal panel 4, the relationship between the projecting pieces 49 and the extension portion 35 are set to the same structure. By the structures, the width (the length in the width direction X) of the extending portion 11c becomes narrower than that of the connecting portions 11a, 11b. Accordingly, the force to return the FPC substrate 11 to the original shape can be reduced when the first FPC substrate 11 is bent. As a result, the liquid crystal panels 3, 4 can be prevented to be unstuck from the frame 2 (see FIG. 1). Further, the stress generated at the extension portions 24, 35 can be reduced, so that even when the liquid crystal panel is a low-profile liquid crystal panel as in the embodiment, breakage of the extension portions 24, 35 caused by the elastic force of the first FPC substrate 11 can be prevented.

Note that in the embodiment, the edge sides 48a, 49b of the projecting pieces 48, 49 are positionally matched to the edge sides 24c, 35c of the extension portions 24, 35. Accordingly, the corners of the proximal ends of the projecting pieces 48, 49 are approximately matched to the edge sides 24, 35 of the extension portion 24, 35 of the substrate. In the structure, when a stress is generated at the corners, there is a fear in that the first FPC substrate 11 is fractured from the corner. In the embodiment, the shape of the proximal ends of the projecting pieces 48, 49 shall be a circular curve-profile, and diameters R1, R2 of the curve-profile shall be set to R1, R2=0.5 mm. Herewith, the first FPC substrate 11 is prevented from fracture from the corners without blocking the flexibility at the extending portion 11c of the first FPC substrate 11.

Further, in the embodiment, the distal ends 48b, 49b of the projecting pieces 48, 49 and the sides 24a, 24b, 35a, 35b of the substrate extension portions 24, 35 are positionally matched in plan view. Further, as shown with an enlarged view shown by the arrow $Z_J$ in FIG. 4, the projecting lengths L1, L2 of the projecting pieces 48, 49 shall be set to L1, L2≧1.5 mm. Herewith, the areas of the connecting portions 11a, 11b overlapping with the substrate extension portions 24, 35 are increased by the area of the projecting pieces 48, 49. Consequently, the substrate extension portions 24, 35 are strengthen by the projecting pieces 48, 49 overlapping with the substrate extension portions 24, 25 in plan view and the first translucent substrates 21, 31 can be prevented from breakage by an external force, for example, such as impact or vibration. The reason why L1, L2 are regulated to satisfy L1, L2≧1.5 mm is that it is recognized by the inventor from the experience that sufficient impact strength resistance and bending strength resistance cannot be provided to the substrate extension portions in the case of L1, L2<1.5 mm and damage may be generated to the extension portions.

Further, in the embodiment, in FIG. 2, the combined thickness T1 of the connecting portion 11a and the ACF 37 is matched to the thickness T2 of the second translucent substrate 22 of the first liquid crystal panel 3. Similarly, the combined thickness T3 of the connecting portion 11b and the ACF 37 is matched to the thickness T4 of the second translucent substrate 32 of the second liquid crystal panel 4. According to the structures, the spaces between the substrate extension portions 24, 35 and the outer frames 8a, 8b can be filled in just enough, so that breakage of the first liquid crystal panel 3 and the second liquid crystal panel 4 caused by movement of the substrate extension portions 24, 35 by vibration or impact can be prevented.

Further, in the embodiment, the projecting pieces 48 extending on the test terminals 25 of the first liquid crystal panel 3 side are adhered by the ACF 37 on the test terminals 25 and the test terminals 25 are covered by the projecting pieces 48 and the ACF 37. Further, the projecting pieces 49 extending on the test terminals 26 at the second liquid crystal panel 4 side are adhered by the ACF 37 on the test terminals 26 and the test terminals 26 are covered by the projecting pieces 49 and the ACF 37. The test terminals 25, 26 are no longer used after completed as a product, so that the test terminals 25, 26 are subjected to insulating after display test. The insulating has been conventionally performed by forming a resin such as silicon to cover the test terminals 25, 26. However, the resin such as silicon is a material which is difficult to form into a thin shape. Accordingly, it has been difficult to apply the resin to the low-profile liquid crystal panels 3, 4 as in the embodiment. Further, it is required to provide a process for applying a resin such as silicon. This may increase the manufacturing cost.

In the embodiment, the test terminals 25, 26 are covered by the projecting pieces 48, 49 and the ACF 37. Accordingly, the covers can be thinly formed as compared with the case when silicon is used, so that the structure can be preferably used for the low-profile liquid crystal panels 3, 4. Further, it is not required to provide a process for applying a resin such as silicon, so that the manufacturing cost can be reduced.

Second Embodiment of Electro Optical Device

Next, another embodiment of the electro optical device according to the invention will be described. The embodiment shall also be described by exemplifying a liquid crystal display device.

Figure 6:
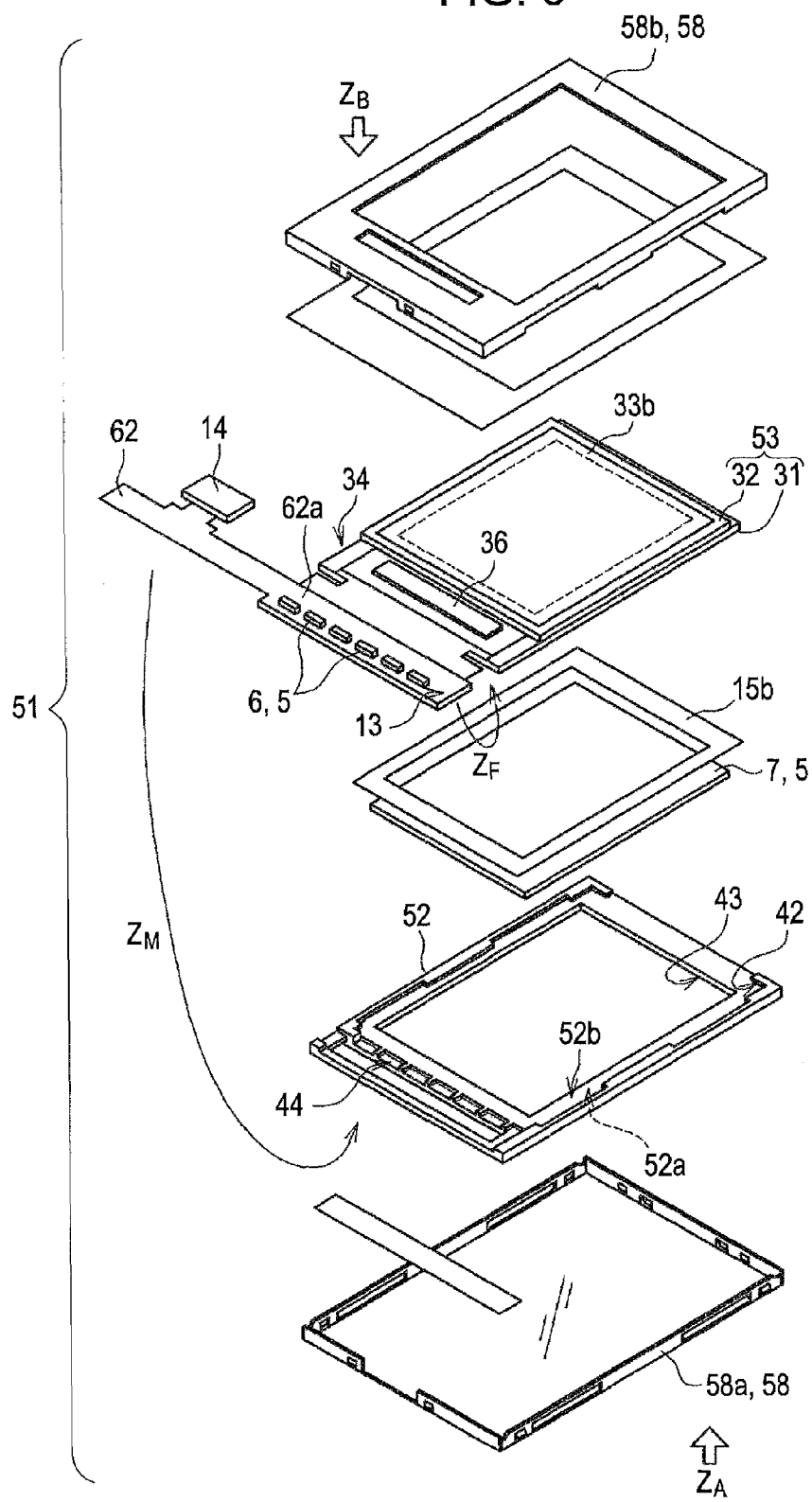
FIG. 6 is an exploded perspective view showing a liquid crystal display device of another embodiment of the electro optical device according to the invention.
Figure 7:
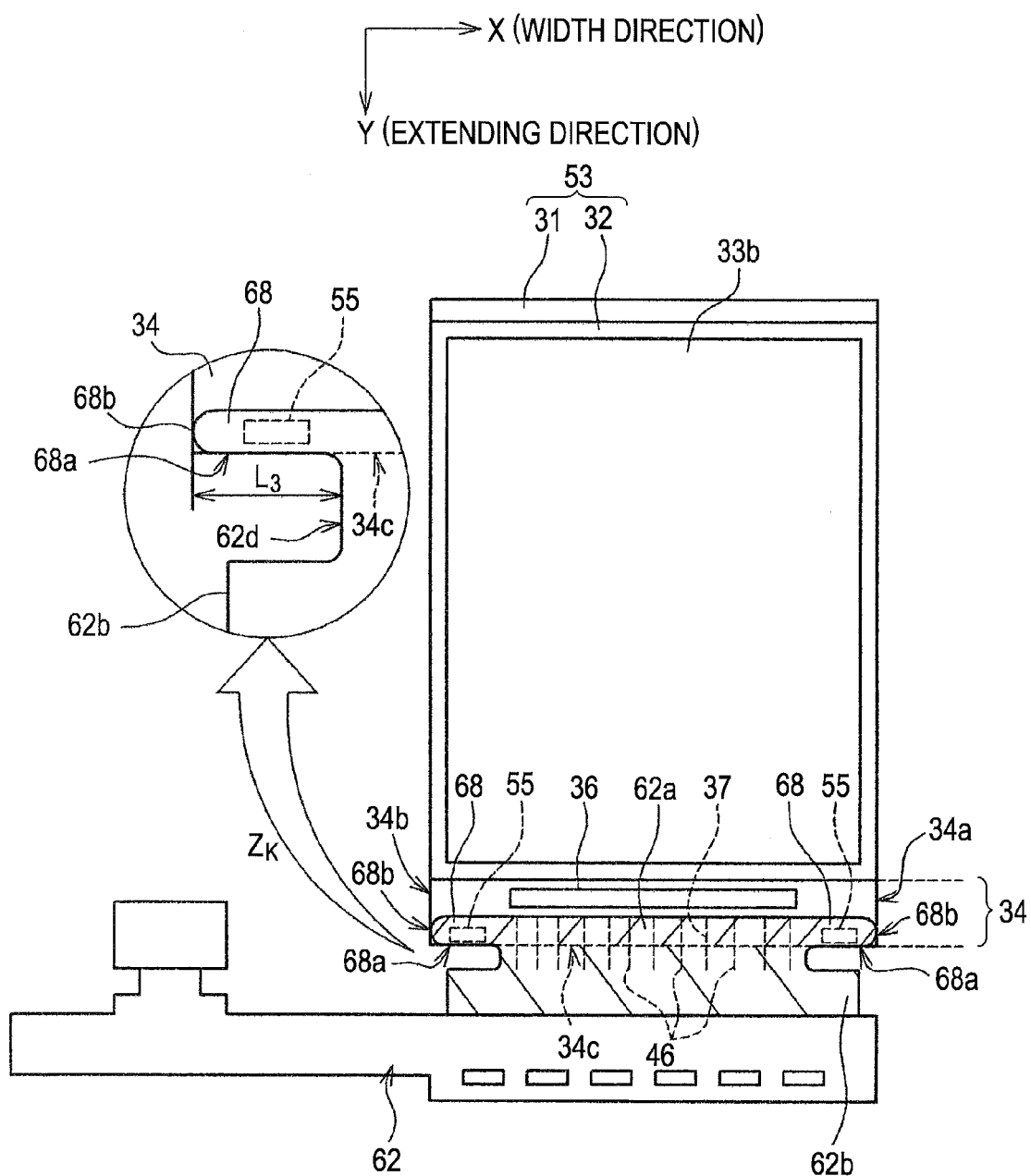
FIG. 7 is a plan view showing the liquid crystal panel of FIG. 6 from the side shown by the arrow $Z_B$.

FIG. 6 is an exploded view showing a liquid crystal display device 51 which is another embodiment of the electro optical device according to the invention. FIG. 7 is a plan view showing a liquid crystal panel from the side show by the arrow $Z_B$ of FIG. 6. The point of the embodiment different from the first embodiment is the next point. In the first embodiment, as shown in FIG. 1, the two liquid crystal panels of the first liquid crystal panel 3 and the second liquid crystal panel 4 are included to constitute the liquid crystal display device 1 which allows the both surface display. On the other hand, in the embodiment, a liquid crystal display device 51 which can display at one surface is constituted by using one liquid crystal panel 53. Hereinafter, the point of the liquid crystal display device 51 of FIG. 6 different from the liquid crystal display device 1 of FIG. 1 will be specifically described. Note that, when the component shown in FIG. 1 is the same as the component shown in FIG. 6, the same reference numeral is used to denote the same component.

In FIG. 6, the liquid crystal display device 51 includes a frame 52 which is a supporting member, a liquid crystal panel 53 as an electro optical panel supported by the frame 52, and a pair of upper and lower outer frames 58 covering the frame 52 and the liquid crystal panel 53. The liquid crystal panel 53 may be constituted by the same structure as that of the second liquid crystal panel 4 shown in FIG. 1 except the position of test terminals. In the embodiment, the structure of the liquid crystal panel 53 shall be the same structure.

In FIG. 6, the liquid crystal panel 53 includes a first translucent substrate 31 and a second translucent substrate 32. The first translucent substrate includes a extension portion flaring outwardly of one of the second translucent substrate 32. As shown in FIG. 7, test terminals 55 are provided on the extension portion 32 at the second translucent substrate 32 side. The test terminal 55 is provided one by one at each of the neighbor of the one side 34a and the neighbor of the other side 34b of the extension portion 34.

Ali FPC substrate 62 which is a flexible wiring substrate is connected to the side edge of the extension portion 34 of the first translucent substrate 31 of the liquid crystal panel 53 by using, for example, the ACF 37. The FPC substrate 62 has the same structure as the second FPC substrate 12 in FIG. 1 except the connecting portion with the extension portion 34.

In FIG. 6, the frame 52 has the same structure as the frame 2 in FIG. 1 except that the number of the housing of the liquid crystal panel is one. That is, as shown in FIG. 6, the frame 52 includes a panel housing 42, a light guide body housing 43, and an LED supporting portion 44. The panel housing 42 is provided at a second surface 52b side of the frame 52 witch is the side at which the arrow $Z_B$ is drawn and the liquid crystal panel 53 is housed in the panel housing 42.

The pair of the outer frames 58 includes a first outer frame 58a provided at the opposite side of the liquid crystal panel 53 (the side at which the arrow $Z_A$ is drawn) with the frame 52 interposed therebetween and a second outer frame 58b provided at the liquid crystal panel 53 side (the side at which the arrow $Z_B$ is drawn). Each of the first outer frame 58a and the second outer frame 58b is formed by using, for example, a metal such as stainless. The first outer frame 58a has a structure in which the opening is eliminated in the first outer frame 8a in FIG. 1. The second outer frame 58b in FIG. 6 may have the same structure as the second outer frame 8b in FIG. 1.

When assembling the liquid crystal display device 51 in FIG. 6, first, the illuminating device 5 having the LED's 6 and the light guide body 7 and the liquid crystal panel 53 are attached to the frame 52. When attaching to the frame 52, the liquid crystal panel 53 is housed in the panel housing 42 after the light guide body 7 is housed in the light guide body housing 43. At this time, the liquid crystal panel 53 is adhered to the light guide body 7 and the frame 52 by the adhesive sheet 15b.

Next, the FPC substrate 62 is bent to the back side as shown by the arrow $Z_F$ and the LED mounting area 13 mounting the LED'S 6 is disposed so as to be opposed to the LED supporting portion 44 of the frame 52. Further, the portion on which the input terminal 14 is provided is bent to the center portion from the side direction as shown by the arrow $Z_M$ and the input terminal 14 is disposed at a first surface 52a side of the frame 52. As described above, in the state where the liquid crystal panel 53 is housed in the frame 52, the first outer frame 58a is attached to the opposite side of the liquid crystal panel 53 with the frame 52 interposed therebetween. Then, the second outer frame 58b is attached to the liquid crystal panel 53 side. As described above, the liquid crystal display device 51 is completed.

In the embodiment, as shown in FIG. 7, the FPC substrate 62 includes a connecting portion 62a which is a wide width portion (the portion shown by the diagonal lines sloping down to the left) overlapping with the extension portion 34 of the liquid crystal panel 53 in plan view and an extending portion 62b which is a narrow width portion (the portion shown by the diagonal lines sloping down in the right) outwardly extending from the extension portion 34.

The connecting portion 62a is a portion connected to a terminal (not shown) of the liquid crystal panel 53 at the extension portion 34 of the first substrate 31. The structure of the connecting portion 62a may be the same structure as the connecting portion 11a of the first FPC substrate 11 shown in FIG. 4.

In FIG. 7, a projecting piece 68 is provided at both side of the area in which the conductive pattern 46 of the connecting portion 62a is formed. The projecting pieces 68 are formed in the shape as described below.

(1) Edge sides 68a at the side of the extending portion 62b are set in parallel with an edge side 34c of the extension portion 34 in the flaring direction in the state where the FPC substrate 62 is connected with the liquid crystal panel 53. Further, (2) the edge sides 68a of the projecting pieces 68 and the edge side 34c of the extension portion 34 are positionally matched in plan view (note that, the edge sides 68a of the projecting pieces 68 may be positioned at the inner side of the edge side 34c of the extension portion 34). Further, (3) distal ends 68b of the projecting pieces 68 and sides 34a, 34b of the extension portion 34 are positionally matched in plan view. That is, the length of the connecting portion 62a in the width direction X and the width of the extension portion 34 are matched. Further, (4) as shown with an enlarged view shown by the arrow $Z_K$, the projecting length L3 which is the length of each of the extending piece 68 extending from the side 62d of the extending portion 62b to the width direction X is set so as to satisfy the relation of L3≧1.5 mm.

Further, the projecting pieces 68 cover the test terminals 55 provided on the surface of the substrate extension portion 34. To be more specific, the connecting portion 62a containing the projecting pieces 68 is adhered on the extension portion 34 by the ACF 37. Accordingly, the projecting pieces 68 extending on the test terminals 55 are adhered on the test terminals 55 by the ACF 37. Accordingly, the test terminals 55 are covered by the projecting pieces 68 and the AFC 37.

Also in the embodiment, in the state where the FPC substrate 62 is connected to the liquid crystal panel 53, the edge sides 68a of the projecting pieces 68 at the extending portion 62b side are set in parallel with the edge side 34c of the extension portion 34 and the edge sides 68a of the projecting pieces 68 are set so as to positionally matched to the edge side 34c of the extension portion 34 in plan view. Consequently, the width of the extending portion 62b becomes narrower than the width of the connecting portion 62a. As a result, when the FPC substrate 62 is bent, the force to return the FPC substrate 62 to the original shape can be reduced. As a result, the liquid crystal panel 53 is prevented to be unstuck from the frame 52 (see FIG. 6). Further, the stress generated at the extension portion 34 can be reduced, so that the breakage of the extension portion 34 caused by the elastic force of the FPC substrate 62 can be prevented.

Further, the distal ends 68b of the projecting pieces 68 and the sides 34a, 34b of the extension portion 34 are set so as to be positionally matched in plan view. Further, as shown with an enlarged view shown by the arrow $Z_K$, the projecting length L3 of the projecting piece 68 projecting form the side 62d of the extending portion 62 is set to satisfy the relation of L3≧1.5 mm.

Herewith, the area of the connecting portion 62a overlapping the extension portion 34 is increased by the area of the projecting pieces 68. Consequently, the extension portion 34 is strengthened by the projecting pieces 68 overlapping the extension portion 34 in plan view, so that the extension portion 34 of the first translucent substrate 31 can be prevented from breakage by the external force, for example, such as impact or vibration.

Another Embodiment

As described above, the invention is described with the preferred embodiments. However, the invention is not limited to the embodiments and various modifications may be made without departing from the scope of the invention described in the appended claims.

For example, in the first embodiment of the electro optical device shown in FIG. 4, the edge sides 48a of the projecting pieces 48 of the FPC substrate 11 are positionally matched to the edge side 24c of the extension portion. However, the edge sides 48a of the projecting pieces 48 may be positioned inside of the edge side 24c of the extension portion 24 (that is, the side of the second translucent substrate 22). The effect in which the stress generated when the FPC substrate 11 is bent can be reduced to a small stress can be obtained also in the structure.

Figure 8:
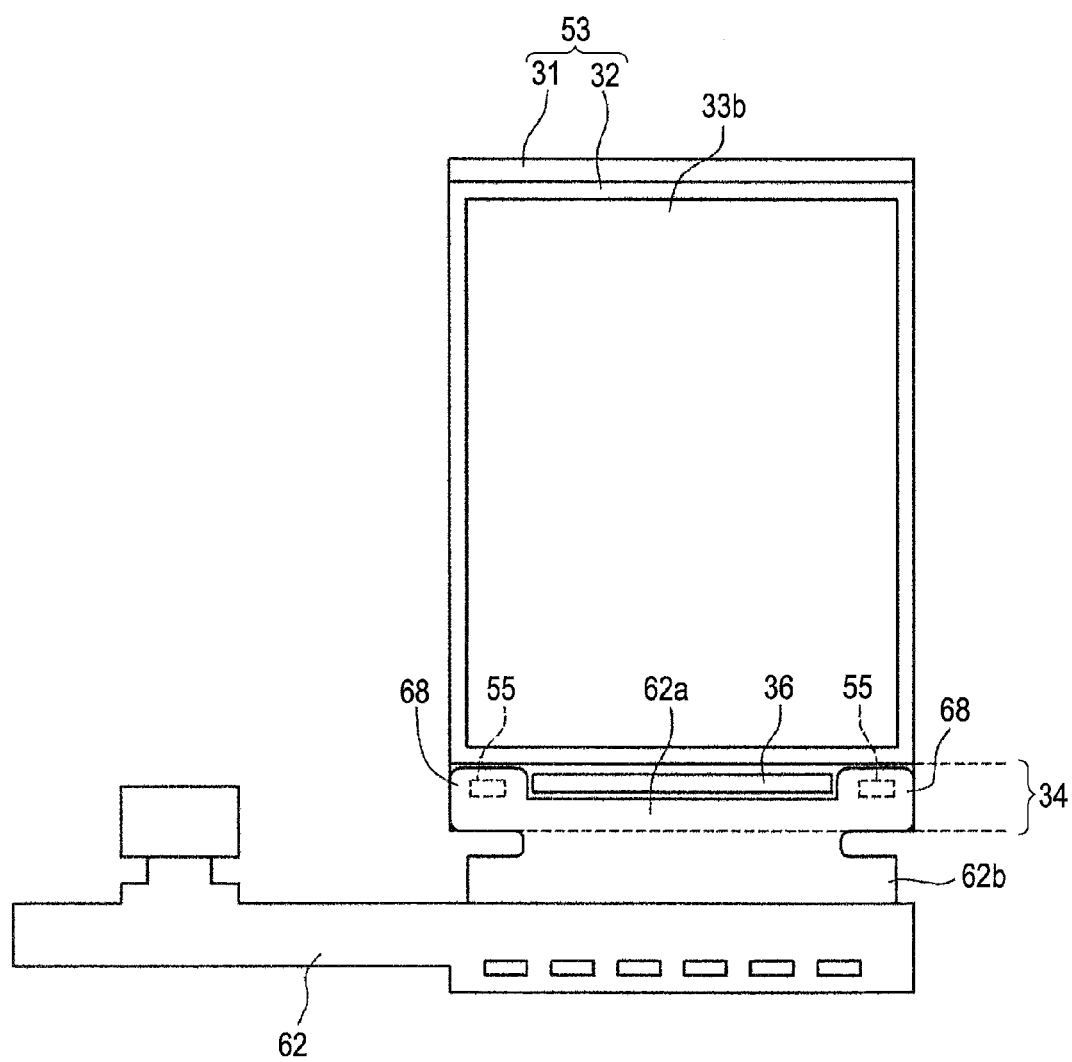
FIG. 8 is a plan view showing another embodiment of an FPC substrate of FIG. 7.

Further, in the second embodiment of the electro optical device shown in FIG. 7, the projecting pieces 68 of the FPC substrate 62 are shaped so as to straightly project in the direction along the edge side 34c of the extension portion 34. However, the shape of the connecting portion 62a including the projecting pieces 68 may be formed in any shape as long as the extension portion 34 is strengthened. For example, as shown in FIG. 8, the connecting portion may be formed to the shape such that the area except the area on which the driving IC 36 is provided is covered (that is, approximately C shape formed around the driving IC 36 in plan view). Herewith, the extension portion 34 can be more surely strengthened.

Further, in FIG. 8, the positions of the test terminals 55 are provided to the positions near the edge side of the second translucent substrate 32 (that is, the position near the inside than that in FIG. 7) unlike the positions of the test terminals 55 in FIG. 7. Also in this case, the test terminals 55 can be surely protected by forming the connecting portion 62a in the shape so as to cover the area except the area on which the driving IC 36 is provided.

Further, in FIG. 5, the projecting pieces 48 are respectively projected from the both sides of the extending portion 11c in the connecting portion 11a which is a wide width portion of the FPC substrate 11. However, only one projecting piece 48 may be projected from one side of the extending portion 11c. Also in this case, the same effects can be obtained as that in the above embodiments such as that the liquid crystal panel is prevented to be unstuck from the frame, and that the breakage of the liquid crystal panel is prevented by strengthening the extension portion.

Further, the invention is also applied to the electro optical device except the liquid crystal display device such as, for example, an organic EL device, an inorganic EL device, a plasma display device (PDP), an electrophoretic display (FED), and a field emission display device (FED).

Embodiment for Electronic Apparatus

Hereinafter, an electronic apparatus according to the invention will be described with reference to an embodiment. Note that the embodiment shows an example of the invention and the invention is not limited to the embodiment.

Figure 9:
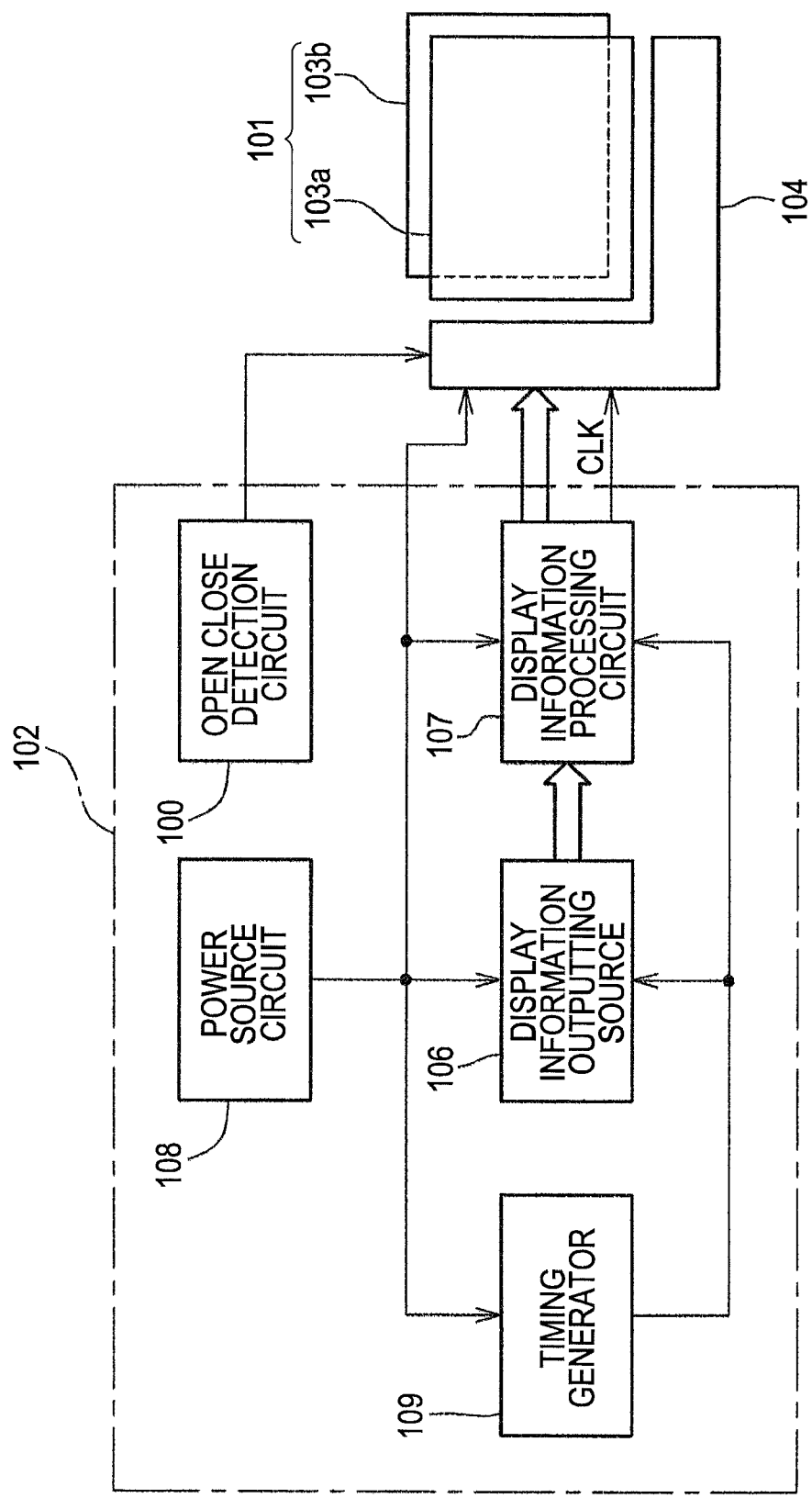
FIG. 9 is a block diagram showing an embodiment of an electronic apparatus according to the invention.

FIG. 9 is a block diagram showing an embodiment of an electronic apparatus according to the invention. Further, FIG. 10 is a diagram showing a folding mobile phone as an example of the electronic apparatus shown by the block diagram of FIG. 9. The electronic apparatus shown in FIG. 9 includes a liquid crystal display device 101 and a control circuit 102 controlling the liquid crystal display device 101. The control circuit 102 includes a display information outputting source 106, a display information processing circuit 107, a power source circuit 108, and a timing generator 109. Then, the liquid crystal display device 101 includes a first liquid crystal panel 103a, a second liquid crystal panel 103b, and a driving circuit 104.

The display information outputting source 106 is equipped with a memory such as a ROM (Read Only Memory) or a RAM (Random Access Memory), a storage unit such as various discs, a tuning circuit for synchronously outputting a digital image signal, and the like. The display information outputting source 106 supplies display information such as an image signal having a predetermined format to the display information processing circuit 107 based on various clock signals generated by the timing generator 109.

Next, the display information processing circuit 107 is equipped with various known circuits such as an amplifying/inverting circuit, a rotation circuit, a gamma connection circuit, a clamp circuit. The display information processing circuit 107 performs the processing of the input display information and supplies the image signal to the driving circuit 104 with the clock signal CLK. Herein, the driving circuit 104 is a generic name of a test circuit or the like with a scanning line driving circuit and a data line driving circuit. Further, the power source circuit 108 supplies a predetermined power voltage to the above each component.

Figure 10A:
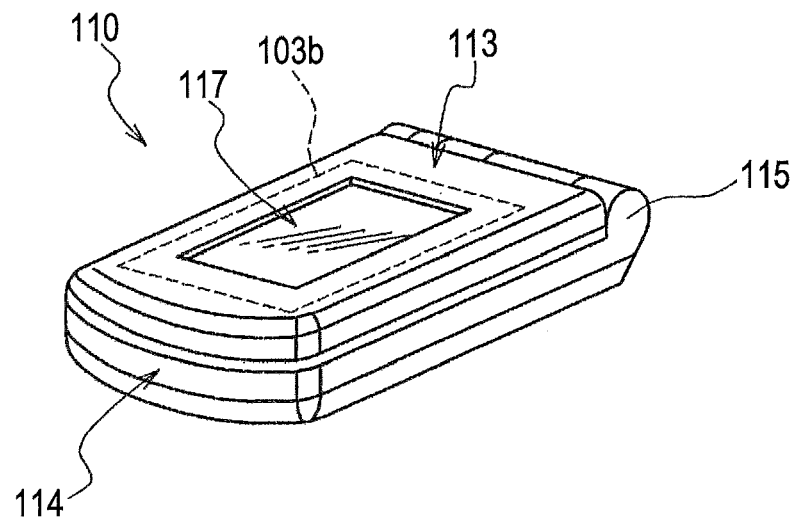
FIGS. 10A and 10B are each a diagram showing an appearance of the electronic apparatus shown in FIG. 9.
Figure 10B:
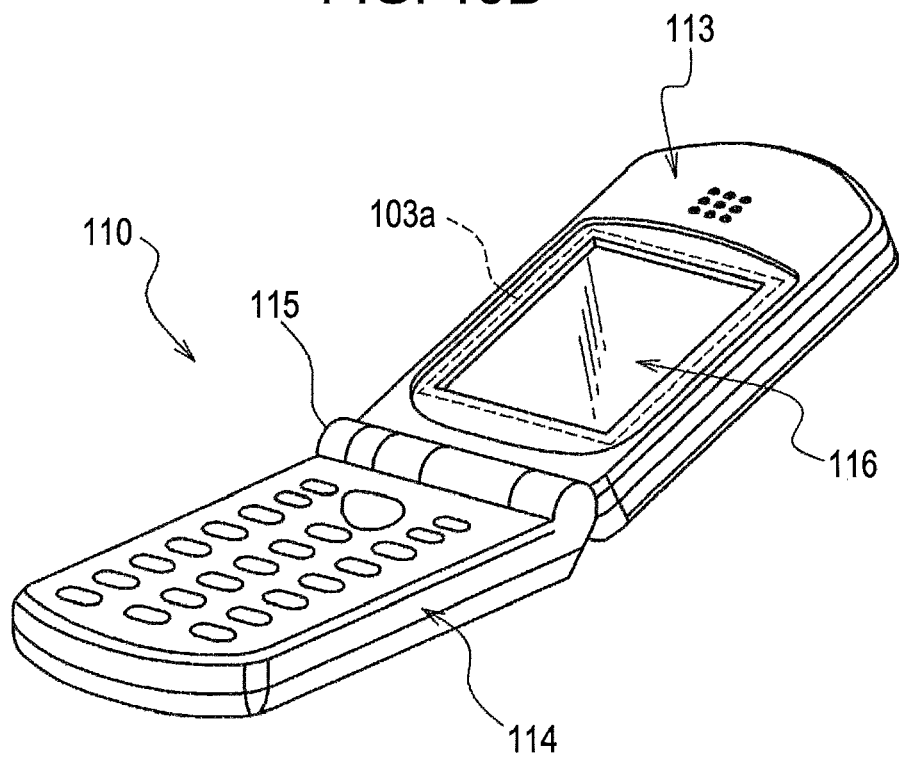

The electronic apparatus shown by the block diagram of FIG. 9 is constituted as the folding mobile phone 110 shown in FIGS. 10A and 10B. In the mobile phone 110, a display body 113 equipped with the first liquid crystal panel 103a and the second liquid crystal panel 103b is coupled with an operation main body 114 via a hinge portion 115 so as to be able to be opened and closed. The first liquid crystal panel 103a is provided at the inner side of the display body 113 as a main display portion 116 for displaying when the display body 113 is opened. On the other hand, the second liquid crystal panel 103b is provided at the outer side of the display body 113 as a sub display portion 117 for displaying when the display body 113 is bent and overlapped with the operation main body 114.

Herein, that which one of the main display portion 116 and the sub display portion 117 is used for display is switched by the folding operation of the mobile phone 110. Accordingly, as shown in FIG. 9, an open close detection circuit 100 for detecting folding operation of the mobile phone 110 is included in the electronic apparatus. The detected result is to be output to the liquid crystal display device 101 by the open close detection circuit 100.

The liquid crystal display device 101 of FIG. 9 can be constituted, for example, by using the liquid crystal display device 1 shown in FIG. 1. In the liquid crystal display device 1, the stress generated at the extension portions 24, 25 can be reduced by narrowing the width of the extending portion 11c of the first FPC substrate 11 as compared with the connecting portions 11a, 11b. Further, the extension portion 24 of the first liquid crystal panel 3 can be strengthened by the projecting pieces 48 of the first FPC substrate 11 and extension portion 35 of the second liquid crystal panel 4 can be strengthened by the projecting pieces 49 of the first FPC substrate 11. As a result, breakage of the extension portions 24, 35 can be prevented. Accordingly, also in the electronic apparatus according the invention using the liquid crystal display device 1, breakage of the substrate can be prevented and enough strength can be obtained.

Another Embodiment

The electronic apparatus of the invention is described above with reference to a preferred embodiment. However, the invention is not limited to the embodiment and various modifications may be made without departing form the scope of the invention described in the appended claims. For example, the invention is not limited to the mobile phone and can be applied to various electronic apparatuses such as a personal computer, a liquid crystal television, a viewfinder-type or direct-view monitor type video tape recorder, a car navigation system, a pager, an electronic organizer, a calculator, a word processor, a work station, a videophone, a POS terminal, a digital still camera, and an electronic book.

What is claimed is:

1. An electro optical device comprising: an electro optical panel formed by sticking a first substrate and a second substrate together; and a flexible wiring substrate connected to the electro optical panel; wherein
the first substrate includes an extension portion flaring from the second substrate,
the wiring substrate includes a base material having flexibility and a conductive pattern provided on the base material,
the wiring substrate is connected to the extension portion of the first substrate by using an adhesive agent,
the wiring substrate includes a wide width portion connected to the extension portion and a narrow width portion continuing to the wide width portion and extending outwardly from an edge side of the extension portion in the flaring direction,
an edge side of the wide width portion at the narrow width portion side is matched to the position of the edge side of the extension portion in the flaring direction or is positioned inside of the edge side of the extension portion in the flaring direction; and
if the length of the wide width portion projecting from a side of the narrow width portion as for the direction perpendicular to the extending direction of the narrow width portion is La, the relation of $$La \geq 1.5 \text{ mm}$$

is satisfied.

2. The electro optical device according to claim 1, wherein a distal end of the wide width portion extends to the position matching to a side of the extension portion of the first substrate.

3. The electro optical device according to claim 1, wherein the wide width portion is adhered to the extension portion to enhance the impact strength resistance and bending strength resistance of the extension portion.

4. The electro optical device according to claim 1, wherein a width of the narrow width portion of the wiring substrate in the direction perpendicular to the extending direction of the narrow width portion and the width of the whole area of the narrow width portion along the extending direction is the same as or narrower than the width of the narrow wide portion at the border between the wide width portion and the narrow width portion.

5. The electro optical device according to claim 1, wherein a test terminal used for testing of the electro optical panel is provided on the extension portion of the first substrate, and the test terminal is covered by the wide width portion of the wiring substrate and the adhesive agent.

6. The electro optical device according to claim 1, wherein the wiring substrate is connected on the surface of the extension portion of the first substrate at a side of the second substrate, and the combined thickness of the wiring substrate and the adhesive agent is matched to the thickness of the second substrate.

7. An electronic apparatus comprising the electro optical device according to claim 1.

8. An electro optical device comprising: an electro optical panel formed by sticking a first substrate and a second substrate together; and a flexible wiring substrate connected to the electro optical panel; wherein
the first substrate includes an extension portion flaring from the second substrate,
the wiring substrate includes a base material having flexibility and a conductive pattern provided on the base material,
the wiring substrate is connected to the extension portion of the first substrate by using an adhesive agent,
the wiring substrate includes a wide width portion connected to the extension portion and a narrow width portion continuing to the wide width portion and extending outwardly from an edge side of the extension portion in the flaring direction,
an edge side of the wide width portion at the narrow width portion side is matched to the position of the edge side of the extension portion in the flaring direction or is positioned inside of the edge side of the extension portion in the flaring direction, and
a width of the narrow width portion of the wiring substrate in the direction perpendicular to the extending direction of the narrow width portion and the width of the whole area of the narrow width portion along the extending direction is the same as or narrower than the width of the narrow width portion at the border between the wide width portion and the narrow width portion.

9. The electro optical device according to claim 8, wherein a shape of a corner of the border between the wide width portion and the narrow width portion of the wiring substrate is a curve shape.

10. The electro optical device according to claim 8, wherein the wiring substrate is connected on the surface of the extension portion of the first substrate at a side of the second substrate, and the combined thickness of the wiring substrate and the adhesive agent is matched to the thickness of the second substrate.

* * * * *